(12) United States Patent
Ueda et al.

(10) Patent No.: US 11,908,945 B2
(45) Date of Patent: Feb. 20, 2024

(54) COATING LIQUID FOR FORMING N-TYPE OXIDE SEMICONDUCTOR FILM, METHOD FOR PRODUCING N-TYPE OXIDE SEMICONDUCTOR FILM, AND METHOD FOR PRODUCING FIELD-EFFECT TRANSISTOR

(71) Applicant: Ricoh Company, Ltd., Tokyo (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/759,698

(22) PCT Filed: Sep. 9, 2016

(86) PCT No.: PCT/JP2016/004122
§ 371 (c)(1),
(2) Date: Mar. 13, 2018

(87) PCT Pub. No.: WO2017/047057
PCT Pub. Date: Mar. 23, 2017

(65) Prior Publication Data
US 2019/0051752 A1    Feb. 14, 2019

(30) Foreign Application Priority Data

Sep. 15, 2015 (JP) .................. 2015-181732
Jul. 22, 2016 (JP) .................. 2016-144854

(51) Int. Cl.
*H01L 29/786* (2006.01)
*H01L 29/66* (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC .......... H01L 29/66969; H01L 29/7869; H01L 29/24; H01L 21/02565; H01L 21/02554;
(Continued)

(56) References Cited

U.S. PATENT DOCUMENTS 8,268,666 B2   9/2012 Abe et al.
8,492,761 B2   7/2013 Abe et al.
(Continued)

FOREIGN PATENT DOCUMENTS

CN   102844874      12/2012
EP   3125296 A1     2/2017
(Continued)

OTHER PUBLICATIONS

English Translation of JP-2017139272 from EPO Global Dossier of Application No. JP2016017557 (Year: 2016).*

(Continued)

*Primary Examiner* — Shaun M Campbell
*Assistant Examiner* — Aneta B Cieslewicz
(74) *Attorney, Agent, or Firm* — XSENSUS LLP

(57) ABSTRACT

A coating liquid for forming an n-type oxide semiconductor film, the coating liquid including: a Group A element, which is at least one selected from the group consisting of Sc, Y, Ln, B, Al, and Ga; a Group B element, which is at least one of In and Tl; a Group C element, which is at least one selected from the group consisting of Group 4 elements, (Continued)

Group 5 elements, Group 6 elements, Group 7 elements, Group 8 elements, Group 9 elements, Group 10 elements, Group 14 elements, Group 15 elements, and Group 16 elements; and a solvent.

11 Claims, 3 Drawing Sheets

(51) Int. Cl.
H01L 21/02 (2006.01)
H01L 29/861 (2006.01)
H01L 29/24 (2006.01)
H01L 29/51 (2006.01)

(52) U.S. Cl.
CPC .. *H01L 21/02576* (2013.01); *H01L 21/02628* (2013.01); *H01L 29/517* (2013.01); *H01L 29/66969* (2013.01); *H01L 29/78618* (2013.01); *H01L 21/02581* (2013.01); *H01L 29/24* (2013.01); *H01L 29/861* (2013.01)

(58) Field of Classification Search
CPC ......... H01L 21/02623; H01L 21/02628; H01L 21/02307; H01L 21/0257; H01L 21/02756; H01L 21/02573; H01L 21/02581; H01L 29/517; H01L 29/78618; H01L 29/861; H01L 21/28167; C09D 11/52; C07F 19/00
See application file for complete search history.

(56) References Cited

U.S. PATENT DOCUMENTS

| | | | |
|---|---|---|---|
| 8,956,969 B2 | 2/2015 | Sone et al. | |
| 9,105,473 B2 | 8/2015 | Ueda et al. | |
| 9,112,039 B2 | 8/2015 | Ueda et al. | |
| 9,418,842 B2 | 8/2016 | Nakamura et al. | |
| 2006/0138382 A1* | 6/2006 | Kijima | C04B 35/493 252/62.9 PZ |
| 2007/0063211 A1* | 3/2007 | Iwasaki | H01L 29/7869 257/98 |
| 2009/0173938 A1* | 7/2009 | Honda | H01L 29/7869 257/43 |
| 2010/0276688 A1* | 11/2010 | Yano | C23C 14/086 257/E29.296 |
| 2011/0006297 A1* | 1/2011 | Inoue | H01L 29/45 257/43 |
| 2011/0128275 A1 | 6/2011 | Ueda et al. | |
| 2011/0278567 A1 | 11/2011 | Ye | |
| 2011/0309313 A1 | 12/2011 | Steiger et al. | |
| 2012/0012835 A1* | 1/2012 | Herman | H01L 21/02565 257/E29.296 |
| 2012/0248451 A1 | 10/2012 | Sone et al. | |
| 2012/0286265 A1 | 11/2012 | Takechi et al. | |
| 2012/0306834 A1 | 12/2012 | Ueda et al. | |
| 2013/0122647 A1 | 5/2013 | Steiger et al. | |
| 2013/0221348 A1 | 8/2013 | Yano et al. | |
| 2013/0221352 A1 | 8/2013 | Steiger et al. | |
| 2013/0240874 A1* | 9/2013 | Maekawa | H01L 29/12 257/43 |
| 2013/0240881 A1 | 9/2013 | Nakamura et al. | |
| 2014/0299877 A1 | 10/2014 | Nakamura et al. | |
| 2014/0367676 A1 | 12/2014 | Haeming et al. | |
| 2015/0001531 A1 | 1/2015 | Ueda et al. | |
| 2015/0028334 A1 | 1/2015 | Matsumoto et al. | |
| 2015/0221506 A1 | 8/2015 | Fujdala et al. | |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2016/0226009 A1 | 8/2016 | Horiki et al. | |
| 2017/0033237 A1 | 2/2017 | Abe et al. | |

FOREIGN PATENT DOCUMENTS

| | | |
|---|---|---|
| JP | 06-096619 | 4/1994 |
| JP | 07-320541 | 12/1995 |
| JP | 2009-177149 | 8/2009 |
| JP | 2010-258058 | 11/2010 |
| JP | 4767616 | 6/2011 |
| JP | WO2011/093506 A1 | 8/2011 |
| JP | 2011-192971 | 9/2011 |
| JP | 2012-518087 | 8/2012 |
| JP | 2013-021289 | 1/2013 |
| JP | 2013-514246 | 4/2013 |
| JP | 2013-115328 | 6/2013 |
| JP | 5386084 | 10/2013 |
| JP | 2013-543931 | 12/2013 |
| JP | 2015-029053 | 2/2015 |
| JP | 2015-181141 | 10/2015 |
| JP | 2017139272 A * | 8/2017 |
| KR | 10-2012-0106896 | 9/2012 |
| TW | 201337036 A | 9/2013 |
| TW | 201521221 A | 6/2015 |
| TW | 201533805 A | 9/2015 |
| WO | WO2011/093506 A1 | 8/2011 |

OTHER PUBLICATIONS

Office Action in corresponding European Application No. 16778123.6, dated Apr. 7, 2020.
Office Action in corresponding Chinese Application No. 201680053386, dated Jul. 2, 2020. (w/English translation).
Office Action in Korean Application No. 10-2020-7002427, dated Aug. 27, 2020. (w/English Translation).
Communication pursuant to Article 94(3) EPC dated Apr. 11, 2022, in corresponding European Patent Application 16778123.6, 6 pp.
International Search Report dated Nov. 23, 2016 for counterpart International Patent Application No. PCT/JP2016/004122 filed Sep. 9, 2016.
Written Opinion dated Nov. 23, 2016 for counterpart International Patent Application No. PCT/JP2016/004122 filed Sep. 9, 2016.
Science, vol. 300, (2003) 1269.
Taiwanese First Office Action dated Mar. 1, 2017 for corresponding Taiwanese Application No. 105129802.
Taiwanese Second Office Action dated Nov. 24, 2017 for corresponding Taiwanese Application No. 105129802.

* cited by examiner

[Fig. 1]
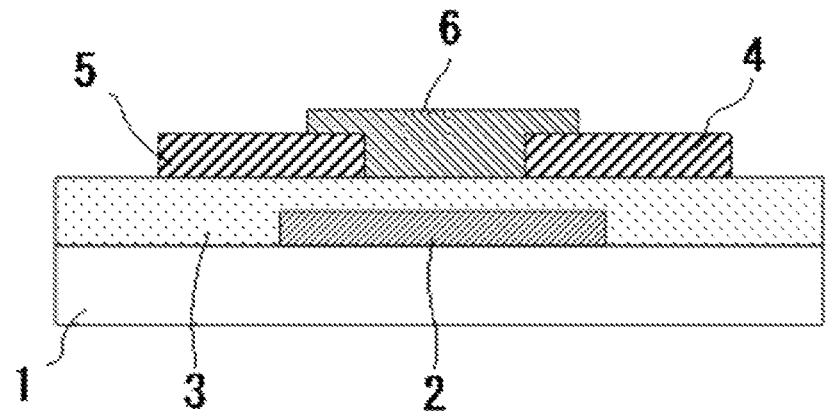
[Fig. 2]
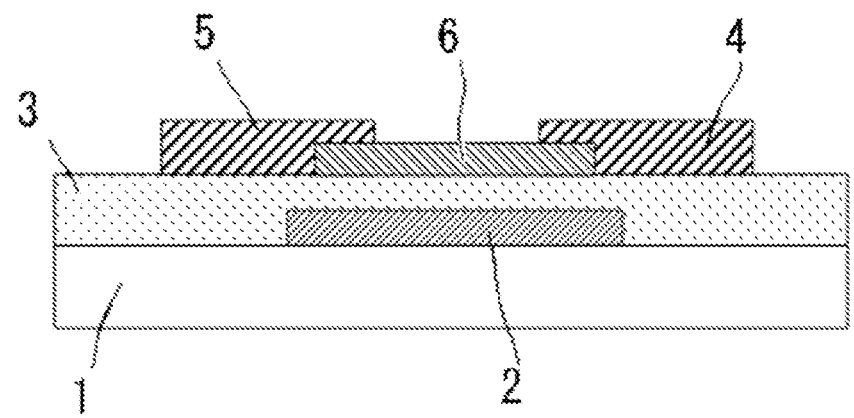
[Fig. 3]
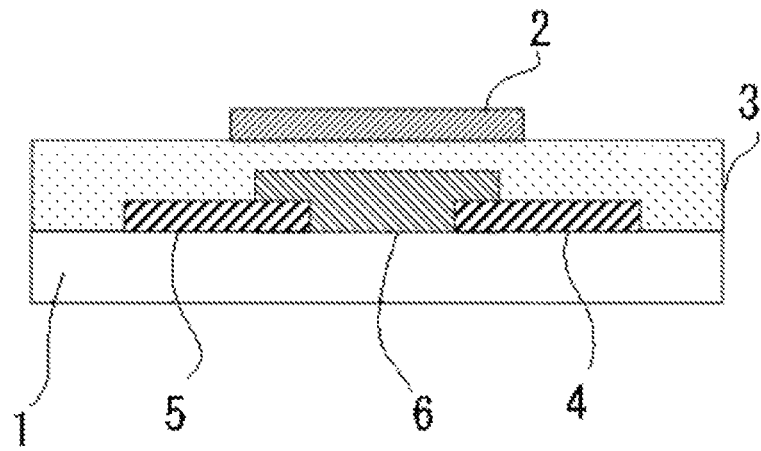

[Fig. 4]
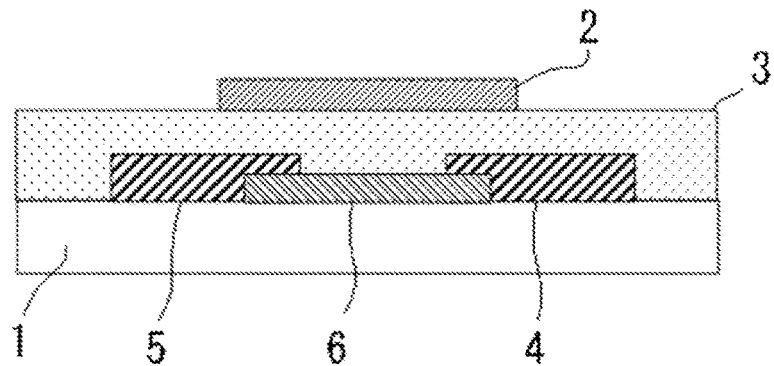
[Fig. 5A]
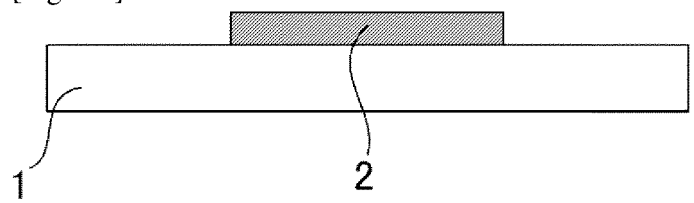
[Fig. 5B]
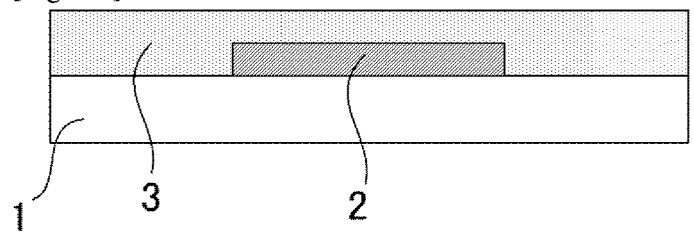
[Fig. 5C]
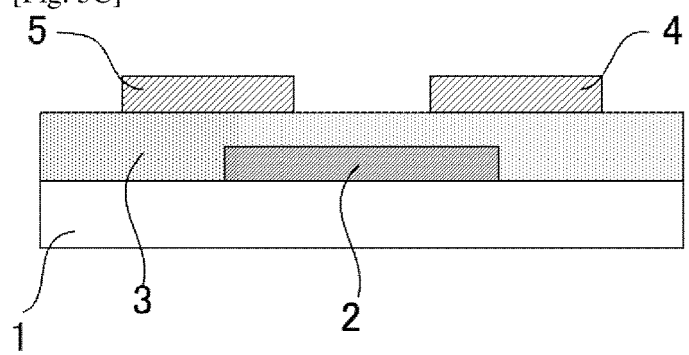
[Fig. 5D]
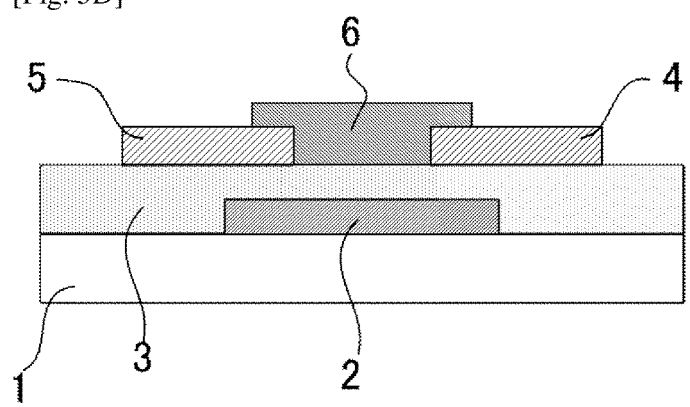

[Fig. 6]
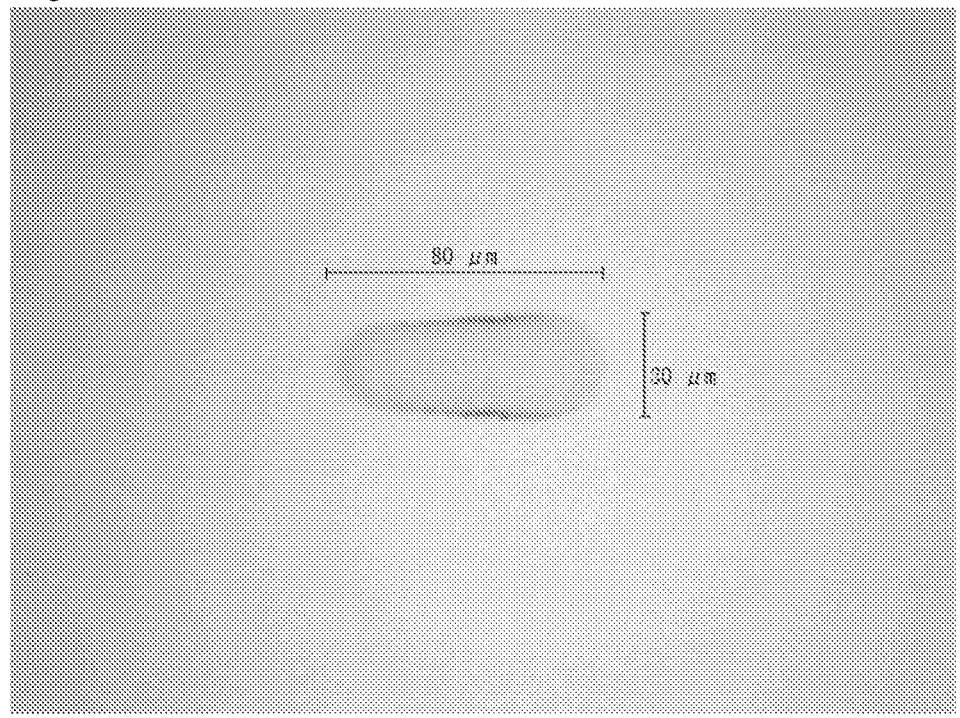
[Fig. 7]
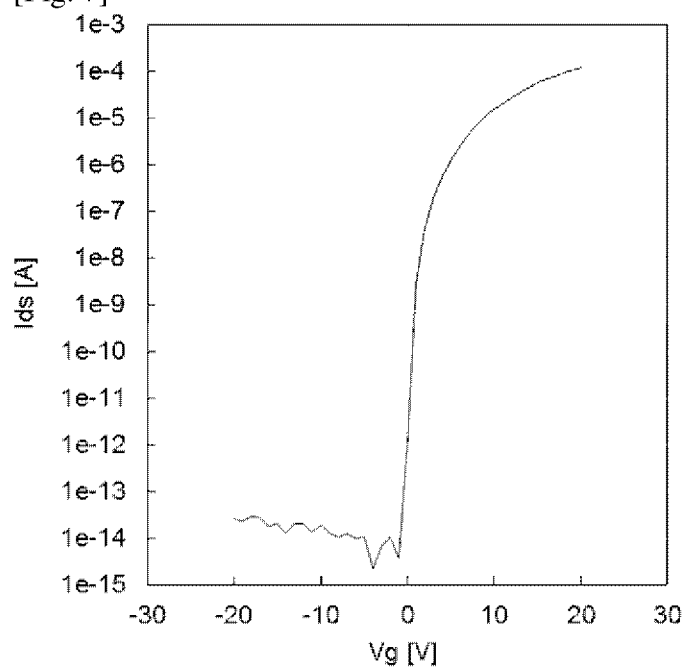

COATING LIQUID FOR FORMING N-TYPE OXIDE SEMICONDUCTOR FILM, METHOD FOR PRODUCING N-TYPE OXIDE SEMICONDUCTOR FILM, AND METHOD FOR PRODUCING FIELD-EFFECT TRANSISTOR

TECHNICAL FIELD

The present invention relates to a coating liquid for forming an n-type oxide semiconductor film, a method for producing an n-type oxide semiconductor film, and a method for producing a field-effect transistor.

BACKGROUND ART

In recent years, In—Ga—Zn—O (IGZO) n-type oxide semiconductors have been found to be semiconductors exhibiting higher carrier mobility than amorphous silicon. Thin film transistors (TFT) including these IGZO oxide semiconductors in active layers have actively been developed (see, for example, NPL 1).

Typical methods for forming such oxide semiconductor thin films include the sputtering method and the laser abrasion method.

However, these vacuum processes require complicated and expensive devices and involve high process cost, which is problematic. The vacuum processes have difficulties in achieving the uniform target formulation. In particular, the vacuum processes have difficulties in obtaining films where trace amounts of elements are uniformly added. Furthermore, due to the use of the vacuum process, it is difficult to reduce an amount of oxygen vacancies in the films. This leads to instability in properties of the films.

Under such circumstances, attention has recently been paid to the liquid phase methods that are simple and are capable of achieving cost reduction. However, IGZO oxide TFTs produced by these processes still have insufficient properties (see, for example, PTL 1).

Therefore, at present, there is a need for provision of a coating liquid for forming an n-type oxide semiconductor film, the coating liquid being capable of forming a large area of an n-type oxide semiconductor film having a desired volume resistivity at a low process temperature in a simple manner and being capable of highly precisely forming an n-type oxide semiconductor film having a desired shape.

CITATION LIST

Patent Literature

PTL 1: Japanese Patent No. 4767616

Non-Patent Literature

NPL 1: Science, Vol. 300, (2003) 1269

SUMMARY OF INVENTION

Technical Problem

The present invention has an object to provide a coating liquid for forming an n-type oxide semiconductor film, the coating liquid being capable of forming a large area of an n-type oxide semiconductor film having a desired volume resistivity at a low process temperature in a simple manner and being capable of highly precisely forming an n-type oxide semiconductor film having a desired shape.

Solution to Problem

Means for solving the aforementioned problems are as follows. That is, a coating liquid of the present invention for forming an n-type oxide semiconductor film includes a Group A element, which is at least one selected from the group consisting of Sc, Y, Ln, B, Al, and Ga, a Group B element, which is at least one of In and Tl, a Group C element, which is at least one selected from the group consisting of Group 4 elements, Group 5 elements, Group 6 elements, Group 7 elements, Group 8 elements, Group 9 elements, Group 10 elements, Group 14 elements, Group 15 elements, and Group 16 elements, and a solvent.

Advantageous Effects of Invention

According to the present invention, it is possible to uniformly produce a large area of a stable n-type oxide semiconductor film having a desired volume resistivity and a desired carrier density at a low process temperature in well-controllable and simple manners. Moreover, it is also possible to provide a coating liquid for forming an n-type oxide semiconductor film, the coating liquid being capable of highly precisely forming an n-type oxide semiconductor film having a desired shape.

BRIEF DESCRIPTION OF DRAWINGS

FIG. 1 is a schematic structural view illustrating one example of a bottom gate/bottom contact field-effect transistor.

FIG. 2 is a schematic structural view illustrating one example of a bottom gate/top contact field-effect transistor.

FIG. 3 is a schematic structural view illustrating one example of a top gate/bottom contact field-effect transistor.

FIG. 4 is a schematic structural view illustrating one example of a top gate/top contact field-effect transistor.

FIG. 5A is a view illustrating one example of a method for producing a field-effect transistor of the present invention (part 1).

FIG. 5B is a view illustrating one example of a method for producing a field-effect transistor of the present invention (part 2).

FIG. 5C is a view illustrating one example of a method for producing a field-effect transistor of the present invention (part 3).

FIG. 5D is a view illustrating one example of a method for producing a field-effect transistor of the present invention (part 4).

FIG. 6 is a microphotograph of a fine pattern prepared in Example 1-13.

FIG. 7 is a graph representing a relationship between gate voltage (Vgs) and electric current (Ids) between the source electrode and the drain electrode of the field-effect transistor prepared in Example 1-28.

DESCRIPTION OF EMBODIMENTS (Coating Liquid for Forming n-Type Oxide Semiconductor Film)

A coating liquid of the present invention for forming an n-type oxide semiconductor film includes at least a Group A element, a Group B element, a Group C element, and a solvent, and further includes other components if necessary.

The Group B element is a main constituting element of the coating liquid of the present invention.

The Group A element prevents generation of the oxygen vacancies attributed to the Group B element.

The Group C element realizes the substitutional doping.

<First Aspect>

In a first aspect, a coating liquid of the present invention for forming an n-type oxide semiconductor film includes at least a Group A element, a Group B element, a Group C element, and a solvent, and further includes other components if necessary.

The Group A element is at least one selected from the group consisting of Sc, Y, Ln (lanthanoid), B, Al, and Ga. These elements belong to the Group 3 elements or the Group 13 elements.

The Group B element is at least one of In and Tl. These elements belong to the Group 13 elements.

The Group C element is at least one selected from the group consisting of the Group 4 elements, the Group 5 elements, the Group 6 elements, the Group 7 elements, the Group 8 elements, the Group 9 elements, the Group 10 elements, the Group 14 elements, the Group 15 elements, and the Group 16 elements.

The coating liquid of the first aspect for forming an n-type oxide semiconductor film is preferably obtained by dissolving, in the solvent, the Group A element, the Group B element, and the Group C element, as at least one form of inorganic salts, oxides, hydroxides, organic acid salts, metal alkoxides, organometallics, and metal complexes. The inorganic salts, the oxides, the hydroxides, the organic acid salts, the metal alkoxides, the organometallics, and the metal complexes are not particularly limited so long as these are uniformly dissolved in the solvent. The inorganic salts, the oxides, the hydroxides, the organic acid salts, the metal alkoxides, the organometallics, and the metal complexes may be dissociated to become ions in the solvent. When the inorganic salts, the oxides, the hydroxides, the organic acid salts, the metal alkoxides, the organometallics, and the metal complexes are dissolved in the coating liquid for forming an n-type oxide semiconductor film, segregation of the concentration in the coating liquid for forming an n-type oxide semiconductor film hardly occurs. Therefore, the coating liquid for forming an n-type oxide semiconductor film can be used for a long period of time. Moreover, thin films prepared from this coating liquid also have uniform formulations, and thus TFTs including the thin films as active layers also have excellent uniformity in properties.

Oxide semiconductors are required to have high mobility. The Group B element is a main constituting element of the coating liquid of the present invention and constitutes the bottom of the conduction band in the electronic structure of the oxide thin film prepared from the coating liquid of the present invention. That is, unoccupied 5s- and 6s-orbitals of In and Tl constitute the bottom of the conduction band having a low effective mass, which realizes high mobility. At the same time, oxides of the Group B element easily generate oxygen vacancies to generate electron carriers. These oxygen vacancies, however, are unstable and easily change by the external atmosphere and post-processes, causing instability in electrical properties. The Group A element, which has high affinity to oxygen, is for eliminating such instability. When the oxide thin film prepared from the present coating liquid includes a certain amount of the Group A element, it is possible to suppress generation of oxygen vacancies while maintaining the electronic structure the Group B element forms.

Generation of the oxygen vacancies is suppressed by the Group A element and the Group B element which are used in combination. In this state, therefore, the number of electron carriers is not sufficient. When the Group C element is added to the coating liquid, substitutional doping can be realized to generate a sufficient number of electron carriers. The Group C element is preferably present in a state of being positively tetravalent to octavalent in the oxide. This state effectively generates electron carriers. Similar to the Group B element, the Group A element is typically trivalent in the oxide and causes neither carrier generation nor compensation. The addition of the Group C element can realize well-controllable, stable carrier generation.

The Group A element is more preferably Sc, Y, and Ln (lanthanoid). Complex oxides of these elements and the Group B elements (In and Tl) all have a bixbyite structure. The bixbyite structure is isotropic and is such a structure that $MO_6$ (M is a central metal) octahedrons gather. Even if the X-ray diffraction or the electron beam diffraction shows amorphous, this local structure is maintained. Therefore, when the Group C element is added to the coating liquid, substitutional doping is efficiently realized.

Oxides of Al and Ga of the Group A element have the corundum structure and the $\beta$-$Ga_2O_3$ structure, which are different from the structures of the oxides of the Group B element. However, both of the structures have $MO_6$ octahedrons as main coordination polyhedrons. Therefore, when present at low concentrations, these elements can be dissolved in the bixbyite structure to form a solid solution. Concentrations of these elements are about 40 at % or less, which is varied depending on the conditions.

Moreover, preferably, the coating liquid of the first aspect for forming an n-type oxide semiconductor film does not include the Group 1 elements, the Group 2 elements, the Group 11 elements, and the Group 12 elements. This is because these elements are positively monovalent or positively bivalent in the oxide and prevent effects of the electron doping by the Group C element.

By use of the coating liquid of the first aspect for forming an n-type oxide semiconductor film one can obtain an n-type oxide semiconductor film having a desired volume resistivity.

Note that, the volume resistivity of the obtained n-type oxide semiconductor film can be controlled by adjusting conditions of the coating liquid for forming an n-type oxide semiconductor film, such as kind, formulation, and concentration of the solvent in which the materials are to be dissolved. Moreover, the volume resistivity of the n-type oxide semiconductor film can also be controlled by adjusting heat treatment conditions after coating of the coating liquid, such as baking temperature, baking time, heating speed, cooling speed, and atmosphere (gas percentage and pressure) during the baking.

Moreover, light can be used to decompose materials and to enhance reaction. Moreover, the volume resistivity is also changed by annealing of the formed film. Therefore, it is also effective to optimize the annealing temperature and the atmosphere.

With the sputtering method, the laser abrasion method, and other methods, it has been difficult to achieve the uniform target formulation. In particular, it has been difficult to obtain films where dopants or trace amounts of elements in amounts of about 2% or less are uniformly added. Moreover, sputtering efficiency is different in individual elements, and thus it has been difficult to uniformly maintain the formulation within duration of a target life. Furthermore, use of the vacuum process makes it difficult to reduce an amount of oxygen vacancies in the films. This leads to instability in properties of the films.

Use of the coating liquid of the first aspect for forming an n-type oxide semiconductor film can solve the problems of the vacuum process, makes it possible to produce an n-type oxide semiconductor film having a uniform and stable formulation, and makes it possible to produce an n-type oxide semiconductor TFT that is stable and has a high performance.

<Second Aspect>

In a second aspect, a coating liquid of the present invention for forming an n-type oxide semiconductor film includes at least a Group A element, a Group B element, a Group C element, and a solvent, and further includes other components if necessary.

The Group A element is at least one selected from the group consisting of Zr, Hf, Ce, Si, and Ge. These elements belong to the Group 3 elements, the Group 4 elements, or the Group 14 elements. Ce belongs to the Group 3 elements, but is stable even if being a positively tetravalent.

The Group B element is at least one selected from the group consisting of Ti, Sn, and Pb. These elements belong to the Group 4 elements or the Group 14 elements.

The Group C element is at least one selected from the group consisting of the Group 5 elements, the Group 6 elements, the Group 7 elements, the Group 8 elements, the Group 9 elements, the Group 10 elements, the Group 15 elements, and the Group 16 elements.

The coating liquid of the second aspect for forming an n-type oxide semiconductor film is preferably obtained by dissolving, in the solvent, the Group A element, the Group B element, and the Group C element, as at least one form of inorganic salts, oxides, hydroxides, organic acid salts, metal alkoxides, organometallics, and metal complexes. The inorganic salts, the oxides, the hydroxides, the organic acid salts, the metal alkoxides, the organometallics, and the metal complexes are not particularly limited so long as these are uniformly dissolved in the solvent. The inorganic salts, the oxides, the hydroxides, the organic acid salts, the metal alkoxides, the organometallics, and the metal complexes may be dissociated to become ions in the solvent. When the inorganic salts, the oxides, the hydroxides, the organic acid salts, the metal alkoxides, the organometallics, and the metal complexes are dissolved in the coating liquid for forming an n-type oxide semiconductor film, segregation of the concentration in the coating liquid for forming an n-type oxide semiconductor film hardly occurs. Therefore, the coating liquid for forming an n-type oxide semiconductor film can be used for a long period of time. Moreover, thin films prepared from this coating liquid also have uniform formulations, and thus TFTs including the thin films as active layers also have excellent uniformity in properties.

Oxide semiconductors are required to have high mobility. The Group B element is a main constituting element of the coating liquid of the present invention and constitutes the bottom of the conduction band in the electronic structure of the oxide thin film prepared from the coating liquid of the present invention. That is, unoccupied 3d-, 5s- and 6s-orbitals of Ti, Sn, and Pb constitute the bottom of the conduction band having a low effective mass, which realizes high mobility. At the same time, oxides of the Group B element easily generate oxygen vacancies to generate electron carriers. These oxygen vacancies, however, are unstable and easily change by the external atmosphere and post-processes, causing instability in electrical properties. The Group A element, which has high affinity to oxygen, is for eliminating such instability. When the oxide thin film prepared from the present coating liquid includes a certain amount of the Group A element, it is possible to suppress generation of oxygen vacancies while maintaining the electronic structure the Group B element forms.

Generation of the oxygen vacancies is suppressed by the Group A element and the Group B element which are used in combination. In this state, therefore, the number of electron carriers is not sufficient. When the Group C element is added to the coating liquid, substitutional doping can be realized to generate a sufficient number of electron carriers. The Group C element is preferably present in a state of being positively pentavalent to octavalent in the oxide. This state effectively generates electron carriers. Similar to the Group B element, the Group A element is typically tetravalent in the oxide and causes neither carrier generation nor compensation. The addition of the Group C element can realize well-controllable, stable carrier generation.

Moreover, preferably, the coating liquid of the second aspect for forming an n-type oxide semiconductor film does not include the Group 1 elements, the Group 2 elements, the Group 3 elements, the Group 11 elements, the Group 12 elements, and the Group 13 elements, provided that Ce of the group 3 elements is allowed to be included in the coating liquid of the second aspect for forming an n-type oxide semiconductor film. This is because these elements are positively monovalent, positively bivalent, or positively trivalent in the oxide, and prevent effects of the electron doping by the Group C element.

By use of the coating liquid of the second aspect for forming an n-type oxide semiconductor film one can obtain an n-type oxide semiconductor film having a desired volume resistivity.

Note that, the volume resistivity of the obtained n-type oxide semiconductor film can be controlled by adjusting conditions of the coating liquid for forming an n-type oxide semiconductor film, such as kind, formulation, and concentration of the solvent in which the materials are to be dissolved. Moreover, the volume resistivity of the n-type oxide semiconductor film can also be controlled by adjusting heat treatment conditions after coating of the coating liquid, such as baking temperature, baking time, heating speed, cooling speed, and atmosphere (gas percentage and pressure) during the baking.

Moreover, light can be used to decompose materials and to enhance reaction. Moreover, the volume resistivity is also changed by annealing of the formed film. Therefore, it is also effective to optimize the annealing temperature and the atmosphere.

With the sputtering method, the laser abrasion method, and other methods, it has been difficult to achieve the uniform target formulation. In particular, it has been difficult to obtain films where dopants or trace amounts of elements in amounts of about 2% or less are uniformly added. Moreover, sputtering efficiency is different in individual elements, and thus it has been difficult to uniformly maintain the formulation within duration of a target life. Furthermore, use of the vacuum process makes it difficult to reduce an amount of oxygen vacancies in the films. This leads to instability in properties of the films.

Use of the coating liquid of the second aspect for forming an n-type oxide semiconductor film can solve the problems of the vacuum process, makes it possible to produce an n-type oxide semiconductor film having a uniform and stable formulation, and makes it possible to produce an n-type oxide semiconductor TFT that is stable and has a high performance.

Hereinafter, the coating liquid for forming an n-type oxide semiconductor film will be described in detail.

The coating liquid for forming an n-type oxide semiconductor film is obtained by dissolving, in the solvent, a Group A element-including compound including the Group A element, a Group B element-including compound including the Group B element, and a Group C element-including compound including the Group C element.

Examples of the Group A element-including compound include inorganic salts, oxides, hydroxides, organic acid salts, metal alkoxides, organometallics, and metal complexes.

Examples of the Group B element-including compound include inorganic salts, oxides, hydroxides, organic acid salts, metal alkoxides, organometallics, and metal complexes.

Examples of the Group C element-including compound include inorganic salts, oxides, hydroxides, organic acid salts, metal alkoxides, organometallics, and metal complexes.

Hereinafter, the above compounds will be described one by one.

<<Indium-Including Compound>>

In the first aspect, indium (In) belongs to the Group B element.

In the first aspect, the indium-including compound belongs to the Group B element-including compound.

The indium-including compound is not particularly limited and may be appropriately selected depending on the intended purpose. Examples of the indium-including compound include organic indium compounds and inorganic indium compounds.

—Organic Indium Compounds—

The organic indium compounds are not particularly limited and may be appropriately selected depending on the intended purpose, so long as the organic indium compounds are compounds each including indium and an organic group. The indium and the organic group are bound via, for example, an ionic bond, a covalent bond, or a coordination bond.

The organic group is not particularly limited and may be appropriately selected depending on the intended purpose. Examples of the organic group include alkoxy groups that may have substituents, acyloxy groups that may have substituents, and acetylacetonato groups that may have substituents. Examples of the alkoxy groups include alkoxy groups including 1 through 6 carbon atoms. Examples of the acyloxy groups include acyloxy groups including 1 through 10 carbon atoms.

Examples of the substituents include halogen and a tetrahydrofuryl group.

Examples of the organic indium compounds include triethoxy indium, indium 2-ethylhexanoate, and indium acetylacetonato.

—Inorganic Indium Compounds—

The inorganic indium compounds are not particularly limited and may be appropriately selected depending on the intended purpose. Examples of the inorganic indium compounds include indium oxoacids, indium halides, indium hydroxides, and indium cyanides.

Examples of the indium oxoacids include indium nitrates, indium sulfates, and indium carbonates.

Examples of the indium halides include indium fluorides, indium chlorides, indium bromides, and indium iodides.

Among them, indium oxoacids and indium halides are preferable, indium nitrates and indium chlorides are more preferable, in terms of high solubility in various solvents.

The indium nitrates are not particularly limited and may be appropriately selected depending on the intended purpose. Examples of the indium nitrates include indium nitrate hydrates. Examples of the indium nitrate hydrates include indium nitrate trihydrate and indium nitrate pentahydrate.

The indium sulfates are not particularly limited and may be appropriately selected depending on the intended purpose. Examples of the indium sulfates include anhydrous indium sulfates and indium sulfate hydrates. Examples of the indium sulfate hydrates include indium sulfate nonahydrate.

The indium chlorides are not particularly limited and may be appropriately selected depending on the intended purpose. Examples of the indium chlorides include indium chloride hydrates. Examples of the indium chloride hydrates include indium chloride tetrahydrate.

These indium-including compounds may be synthesized or may be commercially available products.

<<Thallium-Including Compound>>

In the first aspect, thallium (Tl) belongs to the Group B element.

In the first aspect, the thallium-including compound belongs to the Group B element-including compound.

The thallium-including compound is not particularly limited and may be appropriately selected depending on the intended purpose. Examples of the thallium-including compound include organic thallium compounds and inorganic thallium compounds.

—Organic Thallium Compounds—

The organic thallium compounds are not particularly limited and may be appropriately selected depending on the intended purpose, so long as the organic thallium compounds are compounds each including thallium and an organic group. The thallium and the organic group are bound via, for example, an ionic bond, a covalent bond, or a coordination bond.

The organic group is not particularly limited and may be appropriately selected depending on the intended purpose. Examples of the organic group include the organic groups exemplified in the description of the organic indium compounds.

Examples of the organic thallium compounds include thallium 2-ethylhexanoates, thallium malonates, thallium formates, thallium ethoxides, and thallium acetylacetonato.

—Inorganic Thallium Compounds—

The inorganic thallium compounds are not particularly limited and may be appropriately selected depending on the intended purpose. Examples of the inorganic thallium compounds include thallium oxoacids and thallium halides.

Examples of the thallium oxoacids include thallium nitrates and thallium sulfates.

Examples of the thallium halides include thallium fluorides, thallium chlorides, thallium bromides, and thallium iodides.

Among them, thallium oxoacids, thallium halides, and thallium carboxylates are preferable, thallium nitrates, thallium chlorides, thallium formates, thallium 2-ethylhexanoates are more preferable, in terms of high solubility in various solvent.

The thallium nitrates are not particularly limited and may be appropriately selected depending on the intended purpose. Examples of the thallium nitrates include thallium nitrate hydrates. Examples of the thallium nitrate hydrates include thallium nitrate trihydrate.

The thallium chlorides are not particularly limited and may be appropriately selected depending on the intended purpose. Examples of the thallium chlorides include thallium chloride hydrates. Examples of the thallium chloride hydrates include thallium chloride tetrahydrate.

The thallium formates are not particularly limited and may be appropriately selected depending on the intended purpose. Examples of the thallium formates include thallium formate anhydrides.

The thallium 2-ethylhexanoates are not particularly limited and may be appropriately selected depending on the intended purpose. Examples of the thallium 2-ethylhexanoates include thallium 2-ethylhexanoate anhydrides.

The thallium-including compound includes compounds where the thallium is positively monovalent and compounds where the thallium is positively trivalent. However, both of the compounds can be used as a material of the coating liquid for forming an n-type oxide semiconductor film. It is preferable that the baking conditions be appropriately selected so that the thallium becomes positively trivalent in the semiconductor film obtained after the baking.

These thallium-including compounds may be synthesized or may be commercially available products.

<<Scandium-Including Compound>>

In the first aspect, scandium (Sc) belongs to the Group A element.

In the first aspect, the scandium-including compound belongs to the Group A element-including compound.

The scandium-including compound is not particularly limited and may be appropriately selected depending on the intended purpose. Examples of the scandium-including compounds include organic scandium compounds and inorganic scandium compounds.

—Organic Scandium Compounds—

The organic scandium compounds are not particularly limited and may be appropriately selected depending on the intended purpose, so long as the organic scandium compounds are compounds each including scandium and an organic group. The scandium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic scandium compounds include scandium 2-ethylhexanoate, scandium isopropoxide, and scandium acetylacetonato.

—Inorganic Scandium Compounds—

The inorganic scandium compounds are not particularly limited and may be appropriately selected depending on the intended purpose. Examples of the inorganic scandium compounds include scandium oxoacids and scandium halides.

Examples of the scandium oxoacids include scandium nitrates and scandium carbonates.

Examples of the scandium halides include scandium halides, scandium chlorides, scandium bromides, and scandium iodides.

Among them, scandium oxoacids and scandium halides are preferable, scandium nitrates and scandium chlorides are more preferable, in terms of high solubility in various solvent.

The scandium nitrates are not particularly limited and may be appropriately selected depending on the intended purpose. Examples of the scandium nitrates include scandium nitrate hydrates. Examples of the scandium nitrate hydrates include scandium nitrate pentahydrate.

The scandium chlorides are not particularly limited and may be appropriately selected depending on the intended purpose. Examples of the scandium chlorides include scandium chloride anhydrides and scandium chloride hydrates. Examples of the scandium chloride hydrates include scandium chloride hexahydrate.

These scandium-including compounds may be synthesized or may be commercially available products.

<<Yttrium-Including Compound>>

In the first aspect, yttrium (Y) belongs to the Group A element.

In the first aspect, the yttrium-including compound belongs to the Group A element-including compound.

The yttrium-including compound is not particularly limited and may be appropriately selected depending on the intended purpose. Examples of the yttrium-including compounds include organic yttrium compounds and inorganic yttrium compounds.

—Organic Yttrium Compounds—

The organic yttrium compounds are not particularly limited and may be appropriately selected depending on the intended purpose, so long as the organic yttrium compounds are compounds each including yttrium and an organic group. The yttrium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic yttrium compounds include yttrium 2-ethylhexanoate, yttrium isopropoxide, and yttrium acetylacetonato.

—Inorganic Yttrium Compounds—

The inorganic yttrium compounds are not particularly limited and may be appropriately selected depending on the intended purpose. Examples of the inorganic yttrium compounds include yttrium oxoacids and yttrium halides.

Examples of the yttrium oxoacids include yttrium nitrates, yttrium sulfates, yttrium carbonates, and yttrium phosphates.

Examples of the yttrium halides include yttrium fluorides, yttrium chlorides, yttrium bromides, and yttrium iodides.

Among them, yttrium oxoacids and yttrium halides are preferable, yttrium nitrates and yttrium chlorides are more preferable, in terms of high solubility in various solvent.

The yttrium nitrates are not particularly limited and may be appropriately selected depending on the intended purpose. Examples of the yttrium nitrates include yttrium nitrate hydrates. Examples of the yttrium nitrate hydrates include yttrium nitrate hexahydrate.

The yttrium chlorides are not particularly limited and may be appropriately selected depending on the intended purpose. Examples of the yttrium chlorides include anhydrous yttrium chlorides and yttrium chloride hydrates. Examples of the yttrium chloride hydrates include yttrium chloride hexahydrate.

These yttrium-including compounds may be synthesized or may be commercially available products.

<<Lanthanoid-Including Compound>>

In the first aspect, lanthanoid (Ln) belongs to the Group A element.

In the first aspect, the lanthanoid-including compound belongs to the Group A element-including compound.

A lanthanum-including compound, a cerium-including compound, and a lutetium-including compound as typical examples of the lanthanoid-including compound will be described below.

<<<Lanthanum-Including Compound>>>

Lanthanum (La) is one example of lanthanoid (Ln).

In the first aspect, lanthanum (La) belongs to the Group A element.

In the first aspect, the lanthanum-including compound belongs to the Group A element-including compound.

The lanthanum-including compound is not particularly limited and may be appropriately selected depending on the intended purpose. Examples of the lanthanum-including compound include organic lanthanum compounds and inorganic lanthanum compounds.

—Organic Lanthanum Compounds—

The organic lanthanum compounds are not particularly limited and may be appropriately selected depending on the intended purpose, so long as the organic lanthanum compounds are compounds each including lanthanum and an organic group. The lanthanum and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic lanthanum compounds include lanthanum 2-ethylhexanoate, lanthanum isopropoxide, and lanthanum acetylacetonato.

—Inorganic Lanthanum Compounds—

The inorganic lanthanum compounds are not particularly limited and may be appropriately selected depending on the intended purpose. Examples of the inorganic lanthanum compounds include lanthanum oxoacids and lanthanum halides.

Examples of the lanthanum oxoacids include lanthanum nitrates, lanthanum sulfates, lanthanum carbonates, and lanthanum phosphates.

Examples of the lanthanum halides include lanthanum fluorides, lanthanum chlorides, lanthanum bromides, and lanthanum iodides.

Among them, lanthanum oxoacids and lanthanum halides are preferable, lanthanum nitrates and lanthanum chlorides are more preferable, in terms of high solubility in various solvent.

The lanthanum nitrates are not particularly limited and may be appropriately selected depending on the intended purpose. Examples of the lanthanum nitrates include lanthanum nitrate hydrates. Examples of the lanthanum nitrate hydrates include lanthanum nitrate tetrahydrate and lanthanum nitrate hexahydrate.

The lanthanum chlorides are not particularly limited and may be appropriately selected depending on the intended purpose. Examples of the lanthanum chlorides include anhydrous lanthanum chlorides and lanthanum chloride hydrates. Examples of the lanthanum chloride hydrates include lanthanum chloride heptahydrate.

These lanthanum-including compounds may be synthesized or may be commercially available products.

<<<Cerium-Including Compound>>>

Cerium (Ce) is one example of lanthanoid (Ln).

In the first aspect, cerium (Ce) belongs to the Group A element.

In the second aspect, cerium (Ce) belongs to the Group A element.

In the first aspect, the cerium-including compound belongs to the Group A element-including compound.

In the second aspect, the cerium-including compound belongs to the Group A element-including compound.

The cerium-including compound is not particularly limited and may be appropriately selected depending on the intended purpose. Examples of the cerium-including compound include organic cerium compounds and inorganic cerium compounds.

—Organic Cerium Compounds—

The organic cerium compounds are not particularly limited and may be appropriately selected depending on the intended purpose, so long as the organic cerium compounds are compounds each including cerium and an organic group. The cerium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic cerium compounds include cerium 2-ethylhexanoate, cerium isopropoxide, and cerium acetylacetonato.

—Inorganic Cerium Compounds—

The inorganic cerium compounds are not particularly limited and may be appropriately selected depending on the intended purpose. Examples of the inorganic cerium compounds include cerium oxoacids and cerium halides.

Examples of the cerium oxoacids include cerium nitrates, cerium sulfates, cerium carbonates, and cerium oxalates.

Examples of the cerium halides include cerium fluorides, cerium chlorides, cerium bromides, and cerium iodides.

Among them, cerium oxoacids and cerium halides are preferable, cerium nitrates and cerium chlorides are more preferable, in terms of high solubility in various solvent.

The cerium nitrates are not particularly limited and may be appropriately selected depending on the intended purpose. Examples of the cerium nitrates include cerium nitrate hydrates. Examples of the cerium nitrate hydrates include cerium nitrate hexahydrate.

The cerium chlorides are not particularly limited and may be appropriately selected depending on the intended purpose. Examples of the cerium chlorides include anhydrous cerium chlorides and cerium chloride hydrates. Examples of the cerium chloride hydrates include cerium chloride heptahydrate.

These cerium-including compounds may be synthesized or may be commercially available products.

<<<Lutetium-Including Compound>>>

Lutetium (Lu) is one example of lanthanoid (Ln).

In the first aspect, lutetium (Lu) belongs to the Group A element.

In the first aspect, the lutetium-including compound belongs to the Group A element-including compound.

The lutetium-including compound is not particularly limited and may be appropriately selected depending on the intended purpose. Examples of the lutetium-including compound include organic lutetium compounds and inorganic lutetium compounds.

—Organic Lutetium Compounds—

The organic lutetium compounds are not particularly limited and may be appropriately selected depending on the intended purpose, so long as the organic lutetium compounds are compounds each including lutetium and an organic group. The lutetium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic lutetium compound include lutetium 2-ethylhexanoate, lutetium isopropoxide, and lutetium acetylacetonato.

—Inorganic Lutetium Compounds—

The inorganic lutetium compounds are not particularly limited and may be appropriately selected depending on the intended purpose. Examples of the inorganic lutetium compounds include lutetium oxoacids and lutetium halides.

Examples of the lutetium oxoacids include lutetium nitrates, lutetium sulfates, lutetium carbonates, and lutetium oxalates.

Examples of the lutetium halides include lutetium fluorides, lutetium chlorides, lutetium bromides, and lutetium iodides.

Among them, lutetium oxoacids and lutetium halides are preferable, lutetium nitrates and lutetium chlorides are more preferable, in terms of high solubility in various solvent.

The lutetium nitrates are not particularly limited and may be appropriately selected depending on the intended purpose. Examples of the lutetium nitrates include lutetium nitrate hydrates. Examples of the lutetium nitrate hydrates include lutetium nitrate hexahydrate.

The lutetium chlorides are not particularly limited and may be appropriately selected depending on the intended purpose. Examples of the lutetium chlorides include anhydrous lutetium chlorides and lutetium chloride hydrates. Examples of the lutetium chloride hydrates include lutetium chloride hexahydrate.

These lutetium-including compounds may be synthesized or may be commercially available products.

<<Titanium-Including Compound>>

In the first aspect, titanium (Ti) belongs to the Group C element.

In the second aspect, titanium (Ti) belongs to the Group B element.

In the first aspect, the titanium-including compound belongs to the Group C element-including compound.

In the second aspect, the titanium-including compound belongs to the Group B element-including compound.

The titanium-including compound is not particularly limited and may be appropriately selected depending on the intended purpose. Examples of the titanium-including compound include organic titanium compounds and inorganic titanium compounds.

—Organic Titanium Compounds—

The organic titanium compounds are not particularly limited and may be appropriately selected depending on the intended purpose, so long as the organic titanium compounds are compounds each including titanium and an organic group. The titanium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic titanium compounds include titanium 2-ethylhexanoate, titanium isopropoxide, and titanium acetylacetonato.

—Inorganic Titanium Compounds—

The inorganic titanium compounds are not particularly limited and may be appropriately selected depending on the intended purpose. Examples of the inorganic titanium compounds include titanium oxoacids and titanium halides.

Examples of the titanium oxoacids include titanium sulfates and titanium sulfate oxides.

Examples of the titanium halides include titanium fluorides, titanium chlorides, titanium bromides, and titanium iodides.

Among them, titanium oxoacids and titanium halides are preferable, titanium sulfates and titanium chlorides are more preferable, in terms of high solubility in various solvent.

The titanium sulfates are not particularly limited and may be appropriately selected depending on the intended purpose. Examples of the titanium sulfates include titanium sulfate anhydrides.

The titanium chlorides are not particularly limited and may be appropriately selected depending on the intended purpose. Examples of the titanium chlorides include anhydrous titanium chlorides.

These titanium-including compounds may be synthesized and may be commercially available products.

<<Zirconium-Including Compound>>

In the first aspect, zirconium (Zr) belongs to the Group C element.

In the second aspect, zirconium (Zr) belongs to the Group A element.

In the first aspect, the zirconium-including compound belongs to the Group C element-including compound.

In the second aspect, the zirconium-including compound belongs to the Group A element-including compound.

The zirconium-including compound is not particularly limited and may be appropriately selected depending on the intended purpose. Examples of the zirconium-including compound include organic zirconium compounds and inorganic zirconium compounds.

—Organic Zirconium Compounds—

The organic zirconium compounds are not particularly limited and may be appropriately selected depending on the intended purpose, so long as the organic zirconium compounds are compounds each including zirconium and an organic group. The zirconium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds.

Examples of the organic zirconium compounds include zirconium 2-ethylhexanoate, zirconium isopropoxide, and zirconium acetylacetonato.

—Inorganic Zirconium Compounds—

The inorganic zirconium compounds are not particularly limited and may be appropriately selected depending on the intended purpose. Examples of the inorganic zirconium compounds include zirconium oxoacids and zirconium halides.

Examples of the zirconium oxoacids include zirconium nitrate oxides, zirconium sulfates, zirconium carbonates, and zirconium hydroxides.

Examples of the zirconium halides include zirconium fluorides, zirconium chlorides, zirconium bromides, and zirconium iodides.

Among them, zirconium oxoacids and zirconium halides are preferable, zirconium nitrate oxides and zirconium chlorides are more preferable, in terms of high solubility in various solvent.

The zirconium nitrate oxides are not particularly limited and may be appropriately selected depending on the intended purpose. Examples of the zirconium nitrate oxides include zirconium nitrate oxide hydrates. Examples of the zirconium nitrate oxide hydrates include zirconium nitrate oxide dihydrate.

The zirconium chlorides are not particularly limited and may be appropriately selected depending on the intended purpose. Examples of the zirconium chlorides include anhydrous zirconium chlorides and zirconyl chloride hydrates.

These zirconium-including compounds may be synthesized or may be commercially available products.

<<Hafnium-Including Compound>>

In the first aspect, hafnium (Hf) belongs to the Group C element.

In the second aspect, hafnium (Hf) belongs to the Group A element.

In the first aspect, the hafnium-including compound belongs to the Group C element-including compound.

In the second aspect, the hafnium-including compound belongs to the Group A element-including compound.

The hafnium-including compound is not particularly limited and may be appropriately selected depending on the intended purpose. Examples of the hafnium-including compound include organic hafnium compounds and inorganic hafnium compounds.

—Organic Hafnium Compounds—

The organic hafnium compounds are not particularly limited and may be appropriately selected depending on the intended purpose, so long as the organic hafnium compounds are compounds each including hafnium and an organic group. The hafnium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compounds. Examples of the organic hafnium compounds include hafnium 2-ethylhexanoate, hafnium butoxide, and hafnium acetylacetonato.

—Inorganic Hafnium Compounds—

The inorganic hafnium compounds are not particularly limited and may be appropriately selected depending on the intended purpose. Examples of the inorganic hafnium compounds include hafnium oxoacids and hafnium halides.

Examples of the hafnium oxoacids include hafnium sulfates.

Examples of the hafnium halides include hafnium fluorides, hafnium chlorides, hafnium bromides, and hafnium iodides.

Among them, hafnium oxoacids and hafnium halides are preferable, hafnium sulfates and hafnium chlorides are more preferable, in terms of high solubility in various solvent.

The hafnium chlorides are not particularly limited and may be appropriately selected depending on the intended purpose. Examples of the hafnium chlorides include anhydrous hafnium chlorides and hafnium chloride tetrahydrofuran complexes.

These hafnium-including compounds may be synthesized and may be commercially available products.

As described above, the compounds including indium (In), thallium (Tl), scandium (Sc), yttrium (Y), lanthanoid [lanthanum (La), cerium (Ce), and lutetium (Lu)], titanium (Ti), zirconium (Zr), and hafnium (Hf) have been described in detail. The similar descriptions are applicable to, for example, boron (B), aluminium (Al), gallium (Ga), tin (Sn), lead (Pb), silicon (Si), and germanium (Ge).

<<Group C Element-Including Compound>>

Examples of the Group C element-including compound in the first aspect include Group 4 element-including compounds, Group 5 element-including compounds, Group 6 element-including compounds, Group 7 element-including compounds, Group 8 element-including compounds, Group 9 element-including compounds, Group 10 element-including compounds, Group 14 element-including compounds, Group 15 element-including compounds, and Group 16 element-including compounds.

Examples of the Group C element-including compound in the second aspect include Group 5 element-including compounds, Group 6 element-including compounds, Group 7 element-including compounds, Group 8 element-including compounds, Group 9 element-including compounds, Group 10 element-including compounds, Group 15 element-including compounds, and Group 16 element-including compounds.

The Group 4 element-including compounds are not particularly limited and may be appropriately selected depending on the intended purpose. Examples of the Group 4 element-including compounds include organic metal compounds and inorganic metal compounds.

Examples of the Group 4 element include titanium, zirconium, and hafnium.

The Group 5 element-including compounds are not particularly limited and may be appropriately selected depending on the intended purpose. Examples of the Group 5 element-including compounds include organic metal compounds and inorganic metal compounds.

Examples of the Group 5 element include vanadium, niobium, and tantalum.

The Group 6 element-including compounds are not particularly limited and may be appropriately selected depending on the intended purpose. Examples of the Group 6 element-including compounds include organic metal compounds and inorganic metal compounds.

Examples of the Group 6 element include chrome, molybdenum, and tungsten.

The Group 7 element-including compounds are not particularly limited and may be appropriately selected depending on the intended purpose. Examples of the Group 7 element-including compounds include organic metal compounds and inorganic metal compounds.

Examples of the Group 7 element include manganese and rhenium.

The Group 8 element-including compounds are not particularly limited and may be appropriately selected depending on the intended purpose. Examples of the Group 8 element-including compounds include organic metal compounds and inorganic metal compounds.

Examples of the Group 8 element include iron, ruthenium, and osmium.

The Group 9 element-including compounds are not particularly limited and may be appropriately selected depending on the intended purpose. Examples of the Group 9 element-including compounds include organic metal compounds and inorganic metal compounds.

Examples of the Group 9 element include cobalt, rhodium, and iridium.

The Group 10 element-including compounds are not particularly limited and may be appropriately selected depending on the intended purpose. Examples of the Group 10 element-including compounds include organic metal compounds and inorganic metal compounds.

Examples of the Group 10 element include nickel, palladium, and platinum.

The Group 14 element-including compounds are not particularly limited and may be appropriately selected depending on the intended purpose. Examples of the Group 14 element-including compounds include organic metal compounds and inorganic metal compounds.

Examples of the Group 14 element include silicon, germanium, tin, and lead.

The Group 14 element-including compounds include compounds where the Group 14 element is positively bivalent and compounds where the Group 14 element is positively tetravalent. However, both of the compounds can be used as a material of the coating liquid for forming an n-type oxide semiconductor film. It is preferable that the baking conditions be appropriately selected so that the Group 14 element becomes positively tetravalent in the semiconductor film obtained after the baking.

The Group 15 element-including compounds are not particularly limited and may be appropriately selected depending on the intended purpose. Examples of the Group 15 element-including compounds include organic metal compounds and inorganic metal compounds.

Examples of the Group 15 element include antimony and bismuth.

The Group 15 element-including compounds include compounds where the Group 15 element is positively trivalent and compounds where the Group 15 element is positively pentavalent. However, both of the compounds can be used as a material of the coating liquid for forming an n-type oxide semiconductor film. It is preferable that the baking conditions be appropriately selected so that the Group 15 element becomes positively pentavalent in the semiconductor film obtained after the baking.

The Group 16 element-including compounds are not particularly limited and may be appropriately selected depending on the intended purpose. Examples of the Group 16 element-including compounds include organic metal compounds and inorganic metal compounds.

Examples of the Group 16 element include selenium and tellurium.

The Group 16 element-including compounds include compounds where the Group 16 element is tetravalent and compounds where the Group 16 element is hexavalent. However, both of the compounds can be used as a material of the coating liquid for forming an n-type oxide semiconductor film. It is preferable that the baking conditions be appropriately selected so that the Group 16 element becomes positively hexavalent in the semiconductor film obtained after the baking.

—Organic Metal Compounds—

The organic metal compounds in the Group C element-including compound are not particularly limited and may be appropriately selected depending on the intended purpose, so long as the organic metal compounds are compounds each including the metal and the organic group. The metal and the organic group are bound via, for example, an ionic bond, a covalent bond, or a coordination bond.

The organic group is not particularly limited and may be appropriately selected depending on the intended purpose. Examples of the organic group include the organic groups exemplified in the description of the organic indium compounds.

Examples of the organic metal compounds include carboxylic salts, metal alkoxides, acetylacetonato complexes, and metal carbonyl.

—Inorganic Metal Compounds—

Examples of the inorganic metal compounds in the Group C element-including compound include oxoacids, halides, hydroxides, oxides, oxyhalides, and cyanides.

Examples of the oxoacids include nitrates, sulfates, and carbonates.

Examples of the halides include fluorides, chlorides, bromides, and iodides.

Among them, oxoacids and halides are preferable, nitrates and chlorides are more preferable, in terms of high solubility in various solvent.

These compounds may be synthesized or may be commercially available products.

The Group C element in the first aspect has various valences in materials. However, when the Group C element is mixed with another material, dissolved, and baked, the valences of the Group C element become higher than the trivalence of the Group A element and the Group B element. Therefore, the Group C element has an effect of generating carrier electrons.

In the first aspect, in order to achieve n-type substitutional doping by the Group C element, it is important to introduce, into a cation site to be substituted, a substitutional cation having a larger valence than the cation site, and to maintain a local structure. In the case of using the coating liquid of the first aspect for forming an n-type oxide semiconductor film, even if the film obtained after baking is found to be amorphous (the long-distance structure is not periodical) as observed through the X-ray diffraction, the short-distance structure and the intermediate-distance structure are maintained. In this state, if a dopant having a proper energy level can be incorporated into the cation site to be substituted, carriers are generated. The n-type doping is performed by substituting at least one of trivalent indium ions and trivalent thallium ions with at least one selected from the group consisting of tetravalent metal ions, pentavalent metal ions, hexavalent metal ions, heptavalent metal ions, and octavalent metal ions, which are dopants having larger valences, to make it possible to generate electron carriers.

The Group C element in the second aspect has various valences in materials. However, when the Group C element is mixed with another material, dissolved, and baked, the valences of the Group C element become higher than the tetravalence of the Group A element and the Group B element. Therefore, the Group C element has an effect of generating carrier electrons.

In the second aspect, in order to achieve n-type substitutional doping by the Group C element, it is important to introduce, into a cation site to be substituted, a substitutional cation having a larger valence than the cation site, and to maintain a local structure. In the case of using the coating liquid of the second aspect for forming an n-type oxide semiconductor film, even if the film obtained after baking is found to be amorphous (the long-distance structure is not periodical) as observed through the X-ray diffraction, the short-distance structure and the intermediate-distance structure are maintained. In this state, if a dopant having a proper energy level can be incorporated into the cation site to be substituted, carriers are generated. The n-type doping is performed by substituting at least one selected from the group consisting of tetravalent titanium ions, tetravalent tin ions, and tetravalent leads ions with at least one selected from the group consisting of pentavalent metal ions, hexavalent metal ions, heptavalent metal ions, and octavalent metal ions, which are dopants having larger valences, to make it possible to generate electron carriers.

In the coating liquid for forming an n-type oxide semiconductor film, a total number of atoms of the Group A element (NA) and a total number of atoms of the Group B element (NB) preferably satisfy Formula (1) below.

[Math.1]

$$0.02 \leq [NA/NB] \leq 0.2 \qquad \text{Formula (1)}$$

Here, the atoms of the Group A element and the atoms of the Group B element may be in an ionic state.

In the coating liquid for forming an n-type oxide semiconductor film, a total number of atoms of the Group C element (NC) and the total number of atoms of the Group B element (NB) preferably satisfy Formula (2) below.

[Math.2]

$$0.0001 \leq [NC/NB] \leq 0.05 \qquad \text{Formula (2)}$$

Here, the atoms of the Group B element and the atoms of the Group C element may be in an ionic state.

When the coating liquid for forming an n-type oxide semiconductor film satisfies at least one of the Formula (1) and the Formula (2), preferably satisfies both the Formula (1) and the Formula (2), the n-type oxide semiconductor film formed by coating the coating liquid for forming an n-type oxide semiconductor film can have such volume resistivity as to be able to effectively serve as the active layer of the field-effect transistor.

When the [NC/NB] satisfies the Formula (2), the volume resistivity of the obtained n-type oxide semiconductor film is not excessively high. The field-effect transistor including the above n-type oxide semiconductor film as the active layer has high ON/OFF ratio and exhibits favorable transistor properties.

When the [NA/NB] satisfies the Formula (1), the obtained n-type oxide semiconductor film is not so sensitively affected by the oxygen vacancies. Therefore, a process range over which favorable properties are obtained becomes wider. Moreover, the obtained n-type oxide semiconductor film does not increase in volume resistivity, and reduction in mobility does not easily occur.

Oxide semiconductor films used as active layers of field-effect transistors in driving circuits of displays are required to have high carrier mobility and so-called normally-off characteristics. In order to realize high carrier mobility and normally-off characteristics, the volume resistivity of the oxide semiconductor film is preferably $10^{-2}$ Ωcm or more but $10^9$ Ωcm or less.

When the volume resistivity of the oxide semiconductor film used in the active layer is high, it may be difficult to realize high carrier mobility in an ON state generated by a gate voltage control. Therefore, the volume resistivity of the oxide semiconductor film is more preferably $10^6$ Ωcm or less.

When the volume resistivity of the oxide semiconductor film used in the active layer is low, it may be difficult to reduce Ids (drain-source current) in an OFF state generated by a gate voltage control. Therefore, the volume resistivity of the oxide semiconductor film is more preferably $10^{-1}$ Ωcm or more.

As a specific method for controlling the volume resistivity of the oxide semiconductor film, a method of adjusting an amount of oxygen (density of oxygen vacancies) in the film to change a carrier density is typically used. This method, however, has to realize a desired carrier density by appropriately adjusting the baking conditions and makes the process margin narrow. Moreover, TFT properties easily change due to influence of post-processes and bias stress.

In the present invention, it is possible to control the carrier density by substituting cations with cations having different valences. This can sufficiently reduce the oxygen vacancies and thus stable TFT properties can be obtained.

In the first aspect, when the trivalent cations to be substituted in the n-type oxide semiconductor film are substituted with cations having higher valences, the n-type oxide semiconductor film can efficiently generate carriers. As a result, it is not necessary to increase oxygen vacancies in the baking process to generate carriers, which makes it possible to lower the process temperature.

In the second aspect, when the tetravalent cations to be substituted in the n-type oxide semiconductor film are substituted with cations having higher valences, the n-type oxide semiconductor film can efficiently generate carriers. As a result, it is not necessary to increase oxygen vacancies in the baking process to generate carriers, which makes it possible to lower the process temperature.

The process of coating and baking the coating liquid for forming an n-type oxide semiconductor film can be performed in the atmosphere. Therefore, the oxygen vacancies can sufficiently be reduced as compared with the vacuum processes of the film formation.

As a method for controlling the volume resistivity of the oxide semiconductor film formed by the coating liquid for forming an n-type oxide semiconductor film, it is the most effective to satisfy the ranges of the Formula (1) and the Formula (2). As a result, the oxide semiconductor film effective as an active layer of a TFT can be obtained.

<<Solvent>>

The solvent is not particularly limited and may be appropriately selected depending on the intended purpose, but is preferably an organic solvent.

<<<Organic Solvent>>>

The organic solvent is not particularly limited and may be appropriately selected depending on the intended purpose. The organic solvent is preferably at least one selected from the group consisting of organic acids, organic acid esters, aromatic compounds, diols, glycol ethers, aprotic polar solvents, cyclic ethers, alcohols, and amino alcohols.

—Organic Acids—

The organic acids are not particularly limited and may be appropriately selected depending on the intended purpose. Examples of the organic acids include acetic acid, lactic acid, propionic acid, octanoic acid, neodecanoic acid, and derivatives thereof.

These may be used alone or in combination.

—Organic Acid Esters—

The organic acid esters are not particularly limited and may be appropriately selected depending on the intended purpose. Examples of the organic acid esters include ethyl acetate, propyl acetate, methyl lactate, propyl propionate, and derivatives thereof.

These may be used alone or in combination.

—Aromatic Compounds—

The aromatic compounds are not particularly limited and may be appropriately selected depending on the intended purpose. Examples of the aromatic compounds include toluene, xylene, mesitylene, and derivatives thereof.

These may be used alone or in combination.

—Aprotic Polar Solvent—

The aprotic polar solvents favorably dissolve material compounds and have high stability after dissolution. Therefore, when the aprotic polar solvent is used in the coating liquid for forming an n-type oxide semiconductor film, the n-type oxide semiconductor film having high uniformity and less defect can be obtained.

The aprotic polar solvents are not particularly limited and may be appropriately selected depending on the intended purpose. Preferable examples of the aprotic polar solvents include isophorone, propylene carbonate, tetrahydrofuran, dihydrofuran-2(3H)-one, dimethylformamide, dimethylacetamide, 1,3-dimethyl-2-imidazolidinone, and derivatives thereof.

These may be used alone or in combination.

—Glycol Ether—

The glycol ether favorably dissolves the Group A element-including compound, the Group B element-including compound, and the Group C element-including compound, and have high stability after dissolution. Therefore, when the glycol ether is used in the coating liquid for forming an n-type oxide semiconductor film, the n-type oxide semiconductor film having high uniformity and less defect can be obtained.

The glycol ether is not particularly limited and may be appropriately selected depending on the intended purpose, but is preferably alkylene glycol monoalkyl ether. The number of carbon atoms of the glycol ether is preferably from 3 through 8.

The alkylene glycol monoalkyl ether is preferably at least one selected from the group consisting of ethylene glycol monomethyl ether, ethylene glycol monoethyl ether, ethylene glycol monopropyl ether, ethylene glycol monobutyl ether, propylene glycol-1-monomethyl ether, and propylene glycol-1-monobutyl ether. These alkylene glycol monoalkyl ethers have a boiling point of from about 120 degrees Celsius through about 180 degrees Celsius, which makes it possible to bake the coating liquid at relatively low temperature for a short time. Also, the oxide semiconductor film low in impurities such as carbon and organic matters after the baking can be obtained.

These may be used alone or in combination.

An amount of the glycol ether in the coating liquid for forming an n-type oxide semiconductor film is not particularly limited and may be appropriately selected depending on the intended purpose.

—Diols—

The glycol ether is preferably used in combination with diol. The glycol ether typically has a low viscosity of from about 1.3 cp through about 3.5 cp. Therefore, when the glycol ether is mixed with diol having high viscosity, the viscosity of the coating liquid for forming an n-type oxide semiconductor film can be easily adjusted.

It is believed that the diol is coordinated to various metal salts to improve the metal salts in thermal stability. Therefore, the stable coating liquid for forming an n-type oxide semiconductor film is formed.

The diol is not particularly limited and may be appropriately selected depending on the intended purpose. Examples of the diol include alkanediol and dialkylene glycol. The number of carbon atoms of the diol is preferably from 2 through 6. The diol is more preferably at least one selected from the group consisting of diethylene glycol, 1,2-ethanediol, 1,2-propanediol, and 1,3-butanediol.

These may be used alone or in combination.

The diol including 6 or less carbon atoms has high volatility. Therefore, the diol hardly remains in the n-type oxide semiconductor film formed, to avoid reduction in denseness of the n-type oxide semiconductor film after baking. When the denseness of the n-type oxide semiconductor film is decreased, the semiconductor film may be decreased in carrier mobility to decrease the ON-current.

The diols including from 2 through 6 carbon atoms have a boiling point of from about 180 degrees Celsius through about 250 degrees Celsius. Therefore, the diols are volatilized when the coating liquid for forming an n-type oxide semiconductor film is baked after coated, and the diols hardly remain in the n-type oxide semiconductor film. Moreover, the diols mentioned above have a viscosity of from about 10 cp through about 110 cp. Therefore, when the coating liquid for forming an n-type oxide semiconductor film is coated by, for example, the inkjet method, the diols prevent the coating liquid for forming an n-type oxide semiconductor film from being spread at a time when a droplet of the coating liquid impacts on the substrate. When the coating liquid is coated by the spin coating method or the die coating method, a film thickness can be easily controlled by adjusting a viscosity of the coating liquid.

In the coating liquid for forming an n-type oxide semiconductor film, an amount of the organic solvent in the total amount of the solvents is not particularly limited and may be appropriately selected depending on the intended purpose. The amount is preferably from 50% by mass through 100% by mass, more preferably from 80% by mass through 100% by mass. When a majority of the balance is water of a typical inorganic solvent, which a surface tension is high of 72 dyn/cm, may result in poor discharge properties through inkjet. In addition, the coating liquid may be easily dried at the tip of a nozzle to cause clogging of the nozzle because water has a low boiling point of 100 degrees Celsius. Moreover, when the obtained coating liquid is coated through the spin coating method or the die coating method, the coating liquid is poor in wettability to the substrate due to high surface tension and thus may not be uniformly coated. When the amount falls within the more preferable range, the obtained coating liquid may be low in surface tension, which is advantageous in terms of discharging ability and drying ability.

In the coating liquid for forming an n-type oxide semiconductor film, a ratio of the material of the n-type oxide semiconductor film (for example, the Group A element-including compound, the Group B element-including compound, and the Group C element-including compound) to the organic solvent is not particularly limited and may be appropriately selected depending on the intended purpose. It is preferable that a total amount of the materials of the n-type oxide semiconductor film be from 0.05 mol through 0.5 mol relative to 1 L of the solvent. When the total amount of the materials is 0.05 mol or more, a thickness of the n-type oxide semiconductor film to be formed after baking is not thin, to easily form a continuous film. Moreover, the number of times of the coating necessary for obtaining a desired thickness decreases, resulting in high productivity. The total amount of the materials falling within a range of 0.5 mol or less decreases the number of times of nozzle clogging caused in the tip of an inkjet nozzle when the coating liquid is coated through the inkjet method.

In the coating liquid for forming an n-type oxide semiconductor film, the Group A element-including compound, the Group B element-including compound, and the Group C element-including compound are preferably dissolved in the organic solvent.

<Method for Producing Coating Liquid for Forming n-Type Oxide Semiconductor Film>

A method for producing the coating liquid for forming an n-type oxide semiconductor film is not particularly limited and may be appropriately selected depending on the intended purpose. Examples of the method include a method for producing the coating liquid by mixing a metal salt diol solution with a metal salt glycol ether solution at a desired ratio after the solutions are prepared.

The coating liquid of the present invention for forming an n-type oxide semiconductor film is a suitable coating liquid for producing an n-type oxide semiconductor film. Particularly, the coating liquid for forming an n-type oxide semiconductor film, which satisfies at least one of the Formula (1) and the Formula (2) (preferably satisfies both the Formula (1) and the Formula (2)), is suitable for a coating liquid for producing the active layer of the field-effect transistor.

(N-Type Oxide Semiconductor Film)

One aspect of an n-type oxide semiconductor film of the present invention is obtained by coating the coating liquid of the present invention for forming an n-type oxide semiconductor film on an object to be coated, and drying the object and baking the object after the drying.

One aspect of the n-type oxide semiconductor film of the present invention is a baked product of the coating liquid of the present invention for forming an n-type oxide semiconductor film.

The n-type oxide semiconductor film can be obtained by, for example, the following method of the present invention for producing the n-type oxide semiconductor film.

(Method for Producing n-Type Oxide Semiconductor Film)

In a method for producing the n-type oxide semiconductor film of the present invention, the coating liquid of the present invention for forming an n-type oxide semiconductor film is coated on an object to be coated, and then the object is dried and then baked.

When the coating liquid for forming the n-type oxide semiconductor film satisfies at least one of the Formula (1) and the Formula (2) (preferably satisfies both the Formula (1) and the Formula (2)), it is possible to obtain an n-type oxide semiconductor film particularly suitable for an active layer of a field-effect transistor.

The object to be coated is not particularly limited and may be appropriately selected depending on the intended purpose. Examples of the object include glass substrates and plastic substrates.

When the n-type oxide semiconductor film is used in the active layer of the field-effect transistor, the object used is, for example, a substrate or a gate insulating layer. A shape, a structure, and a size of the substrate are not particularly limited and may be appropriately selected depending on the intended purpose. The material of the substrate is not particularly limited and may be appropriately selected depending on the intended purpose. Examples of the material include glass substrates and plastic substrates.

A method for the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the inkjet method and the nanoimprint method, which can control an amount of the coating liquid to be attached, are preferable because a designed channel width (in other words, the active layer having a desired shape) can be obtained in the production of the n-type oxide semiconductor film having a desired shape, for example, the production of the field-effect transistor. When the coating liquid is coated by the inkjet method and the nanoimprint method, the coating liquid can be coated at room temperature. However, it is preferable that a substrate (object to be coated) heated to about from 40 degrees Celsius through about 100 degrees Celsius make it possible to prevent the coating liquid from being spread through wetting immediately after the coating liquid impacts on the surface of the substrate. It is preferable that the spin coating method and the die coating method be easily used in combination with the existing photolithography techniques.

The drying is not particularly limited and may be appropriately selected depending on the intended purpose so long as volatile components in the coating liquid for forming an n-type oxide semiconductor film can be removed. Note that, in the drying, it is unnecessary to completely remove the volatile component, and the volatile components may be removed in such a degree that the volatile components do not inhibit the baking.

A temperature of the baking is not particularly limited and may be appropriately selected depending on the intended purpose, so long as the temperature is higher than or equal to a temperature at which the metal elements included in the coating liquid form oxides and the temperature is less than a temperature at which the substrate (object to be coated) is deformed with heat. The temperature of the baking is preferably from 150 degrees Celsius through 600 degrees Celsius.

An atmosphere of the baking is not particularly limited and may be appropriately selected depending on the intended purpose. For example, an oxygen atmosphere and an air including oxygen are preferable. The above atmospheres oxidize and gasify organic matters and anions included in the metal element compounds or solvents to be removed from the film. Moreover, when the oxygen vacancies in the film are reduced to improve the film quality, the doping efficiency by incorporation of the Group C element can be improved. Furthermore, the above atmospheres can improve the controlling property of carrier density.

A time of the baking is not particularly limited and may be appropriately selected depending on the intended purpose.

An average thickness of the n-type oxide semiconductor film to be formed is not particularly limited and may be appropriately selected depending on the intended purpose. The average thickness is preferably from 1 nm through 200 nm, more preferably from 2 nm through 100 nm, particularly preferably from 5 nm through 50 nm.

Applications of the n-type oxide semiconductor film are not particularly limited and may be appropriately selected depending on the intended purpose. For example, when the n-type oxide semiconductor film has a volume resistivity of $10^{-2}$ Ωcm or more but $10^3$ Ωcm or less, the n-type oxide semiconductor film can be used for an active layer of a field-effect transistor. The n-type oxide semiconductor film having a volume resistivity of $10^{-1}$ Ωcm or more but $10^1$ Ωcm or less is particularly preferable. Moreover, for example, the n-type oxide semiconductor film having a volume resistivity of more than $10^6$ Ωcm can be used for an antistatic film.

(Field-Effect Transistor)

A field-effect transistor of the present invention includes at least a gate electrode, a source electrode, a drain electrode, an active layer, and a gate insulating layer, and further includes other members if necessary.

The field-effect transistor of the present invention can be produced, for example, by a method of the present invention for producing a field-effect transistor.

<Gate Electrode>

The gate electrode is not particularly limited and may be appropriately selected depending on the intended purpose, so long as the gate electrode is an electrode configured to apply gate voltage.

A material of the gate electrode is not particularly limited and may be appropriately selected depending on the intended purpose. Examples of the material include metals (e.g., platinum, palladium, gold, silver, copper, zinc, aluminium, nickel, chrome, tantalum, molybdenum, and titanium), alloys of these metals, and mixtures of these metals. Moreover, examples of the material include conductive oxides (e.g., indium oxide, zinc oxide, tin oxide, gallium oxide, and niobium oxide), complex compounds of the above oxides, and mixtures thereof.

An average thickness of the gate electrode is not particularly limited and may be appropriately selected depending on the intended purpose, but is preferably from 40 nm through 2 micro meters, more preferably from 70 nm through 1 micro meter.

<Gate Insulating Layer>

The gate insulating layer is not particularly limited and may be appropriately selected depending on the intended purpose, so long as the gate insulating layer is an insulating layer formed between the gate electrode and the active layer.

A material of the gate insulating layer is not particularly limited and may be appropriately selected depending on the intended purpose. Examples of the material include inorganic insulating materials and organic insulating materials.

Examples of the inorganic insulating materials include silicon oxide, aluminium oxide, tantalum oxide, titanium oxide, yttrium oxide, lanthanum oxide, hafnium oxide, zirconium oxide, silicon nitride, aluminium nitride, and mixtures thereof.

Examples of the organic insulating materials include polyimide, polyamide, poly-acrylate, polyvinyl alcohol, and novolak resins.

An average thickness of the gate insulating layer is not particularly limited and may be appropriately selected depending on the intended purpose, but is preferably from 30 nm through 3 micro meters, more preferably from 100 nm through 1 micro meter.

<Source Electrode and Drain Electrode>

The source electrode and the drain electrode are not particularly limited and may be appropriately selected depending on the intended purpose.

A material of the source electrode and a material of the drain electrode are not particularly limited and may be appropriately selected depending on the intended purpose. Examples of these materials include the same materials as described in the exemplary materials of the gate electrode.

An average thickness of the source electrode and the drain electrode is not particularly limited and may be appropriately selected depending on the intended purpose, but are preferably from 40 nm through 2 micro meters, more preferably from 70 nm through 1 micro meter.

<Active Layer>

In one aspect, the active layer is an active layer formed between the source electrode and the drain electrode and formed of an n-type oxide semiconductor film. The active layer includes an n-type oxide semiconductor film obtained by coating the coating liquid of the present invention for forming an n-type oxide semiconductor film.

Moreover, in another aspect, the active layer is an active layer formed between the source electrode and the drain electrode and formed of an n-type oxide semiconductor film. The active layer includes the n-type oxide semiconductor film of the present invention.

An average thickness of the active layer is not particularly limited and may be appropriately selected depending on the intended purpose, but is preferably from 1 nm through 200 nm, more preferably from 5 nm through 100 nm.

A structure of the field-effect transistor is not particularly limited and may be appropriately selected depending on the intended purpose. Examples of the structure include a bottom gate/bottom contact field-effect transistor (FIG. 1), a bottom gate/top contact field-effect transistor (FIG. 2), a top gate/bottom contact field-effect transistor (FIG. 3), and a top gate/top contact field-effect transistor (FIG. 4).

Here, in FIGS. 1 to 4, the reference numerical 1 denotes a substrate, the reference numerical 2 denotes a gate electrode, the reference numerical 3 denotes a gate insulating layer, the reference numerical 4 denotes a source electrode, the reference numerical 5 denotes a drain electrode, and the reference numerical 6 denotes an active layer, respectively.

The field-effect transistor of the present invention can be suitably used for field-effect transistors for logic circuits and pixel circuits such as liquid crystal displays, organic EL displays, and electrochromic displays.

(Method for Producing Field-Effect Transistor)

A method for producing the field-effect transistor of the present invention (first production method) includes:

a step of forming a gate electrode on a substrate;

a step of forming a gate insulating layer on the gate electrode;

a step of forming a source electrode and a drain electrode on the gate insulating layer to be spaced from each other; and a step of forming an active layer on the gate insulating layer, and in a channel region between the source electrode and the drain electrode, the active layer being formed of an n-type oxide semiconductor.

A method for producing the field-effect transistor of the present invention (second production method) includes:

a step of forming a source electrode and a drain electrode on a substrate to be spaced from each other;

a step of forming an active layer on the substrate and in a channel region between the source electrode and the drain electrode, the active layer being formed of an n-type oxide semiconductor;

a step of forming a gate insulating layer on the active layer; and a step of forming a gate electrode on the gate insulating layer.

<First Production Method>

The first production method will be described hereinafter.

—Substrate—

A shape, a structure, and a size of the substrate are not particularly limited and may be appropriately selected depending on the intended purpose.

The substrate is not particularly limited and may be appropriately selected depending on the intended purpose. Examples of the substrate include glass substrates and plastic substrates.

A material of the glass substrates is not particularly limited and may be appropriately selected depending on the intended purpose. Examples of the material include alkali-free glass and silica glass.

A material of the plastic substrates is not particularly limited and may be appropriately selected depending on the intended purpose. Examples of the material include polycarbonate (PC), polyimide (PI), polyethylene terephthalate (PET), and polyethylene naphthalate (PEN).

Note that, the substrate is preferably subjected to a pre-treatment (e.g., oxygen plasma, UV-ozone, and washing through UV irradiation) in order to wash the surface of the substrate and to improve close adhesiveness.

—Step of Forming Gate Electrode—

The step of forming a gate electrode is not particularly limited and may be appropriately selected depending on the intended purpose, so long as the step is a step of forming a gate electrode on the substrate. Examples of the step include (i) a step of forming a gate electrode by forming a film by, for example, the sputtering method or the dip coating method to pattern the film through photolithography; and (ii) a step of forming a gate electrode by directly forming a film having a desired shape by the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of forming a gate insulating layer on the gate electrode. Examples of the step include (i) a step of forming a gate insulating layer by forming a film by, for example, the sputtering method or the dip coating method to pattern the film through photolithography; and (ii) a step of forming a gate insulating layer by directly forming a film having a desired shape by the printing process, such as inkjet printing, nanoimprinting, or gravure printing.

—Step of Forming Source Electrode and Drain Electrode—

The step of forming a source electrode and a drain electrode is not particularly limited and may be appropriately selected depending on the intended purpose, so long as the step is a step of forming a source electrode and a drain electrode on the gate insulating layer to be spaced from each other. Examples of the step include (i) a step of forming a source electrode and a drain electrode by forming each film by, for example, the sputtering method or the dip coating method to pattern the film through photolithography; and (ii) a step of forming a source electrode and a drain electrode by directly forming each film having a desired shape by the printing process, such as inkjet printing, nanoimprinting, or gravure printing.

—Step of Forming Active Layer—

The step of forming an active layer is not particularly limited and may be appropriately selected depending on the intended purpose, so long as the step is a step of forming an active layer on the gate insulating layer, and in a channel region between the source electrode and the drain electrode, the active layer being formed of an n-type oxide semiconductor obtained by coating the coating liquid of the present invention for forming an n-type oxide semiconductor film.

In the step of forming the active layer, it is preferable that, in the coating liquid for forming an n-type oxide semiconductor film, a total number of atoms of the Group A (NA), a total number of atoms of the Group B (NB), and a total number of atoms of the Group C (NC) be adjusted to control at least one selected from the group consisting of volume resistivity, carrier mobility, and carrier density of the n-type oxide semiconductor. As a result, a field-effect transistor having desired properties (e.g., threshold voltage) can be obtained. Particularly, the Group C element-including compound can effectively generate carriers in the active layer, resulting in a low process temperature.

In the step of forming the active layer, it is preferable that the coating liquid for forming an n-type oxide semiconductor film include the glycol ether and the diol, and a viscosity of the coating liquid for forming an n-type oxide semiconductor film be controlled by adjusting a mixing ratio between the glycol ether and the diol in the coating liquid for forming an n-type oxide semiconductor film. Moreover, in order to obtain a desired film thickness, a desired surface shape, and a desired coating property, the other solvents can be added to the coating liquid, or a concentration of the coating liquid can be adjusted. As a result, the coating liquid is excellent in coating property, and a field-effect transistor having a favorable channel-forming state can be obtained.

A method for forming the n-type oxide semiconductor by coating the coating liquid for forming an n-type oxide semiconductor film is not particularly limited and may be appropriately selected depending on the intended purpose. Examples of the method include a method for forming the n-type oxide semiconductor by coating the coating liquid for forming an n-type oxide semiconductor film on the substrate on which the gate insulating layer is formed, to bake the substrate after the drying the substrate.

A method of the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the inkjet method and the nanoimprint method, which can control an amount of the coating liquid to be attached, are preferable because a designed channel width (in other words, the active layer having a desired shape) can be obtained in the production of the field-effect transistor. It is preferable that the spin coating method and the die coating method be easily used in combination with the existing photolithography technology.

The drying is not particularly limited and may be appropriately selected depending on the intended purpose so long as a volatile component in the coating liquid for forming an n-type oxide semiconductor film can be removed. Note that, in the drying, it is unnecessary to completely remove the volatile component, and the volatile component may be removed in such a degree that the solvent does not inhibit the baking.

A temperature of the baking is not particularly limited and may be appropriately selected depending on the intended purpose, but is preferably from 150 degrees Celsius through 600 degrees Celsius.

In the first production method, the order of the step of forming the source electrode and the drain electrode and the step of forming the active layer is not taken into account. The step of forming the active layer may be performed after the step of forming the source electrode and the drain electrode, and the step of forming the source electrode and the drain electrode may be performed after the step of forming the active layer.

In the first production method, when the step of forming the active layer is performed after the step of forming the source electrode and the drain electrode, a bottom gate/bottom contact field-effect transistor can be produced.

In the first production method, the step of forming the source electrode and the drain electrode is performed after the step of forming the active layer, a bottom gate/top contact field-effect transistor can be produced.

Here, a method for producing a bottom gate/bottom contact field-effect transistor will be described with reference to FIGS. 5A to 5D.

First, a conductor film formed of, for example, aluminium is formed on a substrate 1 formed of, for example, a glass substrate by the sputtering method. Then, the thus-formed conductor film is patterned by photolithography to form a gate electrode 2 (FIG. 5A).

Next, a gate insulating layer 3 formed of, for example, $SiO_2$ is formed on the gate electrode 2 and the substrate 1 by the sputtering method so as to cover the gate electrode 2 (FIG. 5B).

Then, a conductor film formed of, for example, ITO is formed on the gate insulating layer 3 by the sputtering method. The thus-formed conductor film is patterned by the etching to form a source electrode 4 and a drain electrode 5 (FIG. 5C).

The coating liquid for forming an oxide semiconductor film was coated on the gate insulating layer 3 by the inkjet method so as to cover a channel region formed between the source electrode 4 and the drain electrode 5. The coated coating liquid is subjected to the heat treatment to form an active layer 6 formed of the oxide semiconductor film (FIG. 5D).

As described above, a field-effect transistor is produced.

<Second Production Method>

The second production method will be described hereinafter.

—Substrate—

The substrate is not particularly limited and may be appropriately selected depending on the intended purpose. Examples of the substrate include the same substrates as exemplified in the description of the first production method.

—Step of Forming Source Electrode and Drain Electrode—

A step of forming the source electrode and the drain electrode is not particularly limited and may be appropriately selected depending on the intended purpose, so long as the step is a step of forming a source electrode and a drain electrode on the substrate to be spaced. Examples of the step include the same step as the step exemplified in the description of the method for forming the source electrode and the drain electrode in the first production method.

—Step of Forming Active Layer—

The step of forming an active layer is not particularly limited and may be appropriately selected depending on the intended purpose, so long as the step is a step of forming an active layer on the substrate and in a channel region between the source electrode and the drain electrode, the active layer being formed of an n-type oxide semiconductor obtained by coating, on the substrate, the coating liquid of the present invention for forming an n-type oxide semiconductor film.

A method for forming an n-type oxide semiconductor by coating the coating liquid for forming an n-type oxide semiconductor film is not particularly limited and may be appropriately selected depending on the intended purpose. Examples of the method include the same method as the method exemplified in the description of the step of forming the active layer in the first production method.

In the step of forming the active layer, it is preferable that, in the coating liquid for forming an n-type oxide semiconductor film, a total number of atoms of the Group A (NA), a total number of atoms of the Group B (NB), and a total number of atoms of the Group C (NC) be adjusted to control at least one selected from the group consisting of volume resistivity, carrier mobility, and carrier density of the n-type oxide semiconductor. As a result, a field-effect transistor having desired properties (e.g., threshold voltage) can be obtained. Particularly, the Group C element-including compound can effectively generate carriers in the active layer, resulting in a low process temperature.

In the step of forming the active layer, it is preferable that the coating liquid for forming an n-type oxide semiconductor film include the glycol ether and the diol, and a viscosity of the coating liquid for forming an n-type oxide semiconductor film be controlled by adjusting a mixing ratio between the glycol ether and the diol in the coating liquid for forming an n-type oxide semiconductor film. Moreover, in order to obtain a desired film thickness, a desired surface shape, and a desired coating property, the other solvents can be added to the coating liquid, or a concentration of the coating liquid can be adjusted. As a result, the coating liquid is excellent in coating property, and a field-effect transistor having a favorable channel-forming state can be obtained.

—Step of Forming Gate Insulating Layer—

A step of forming the gate insulating layer is not particularly limited and may be appropriately selected depending on the intended purpose, so long as the step of forming the gate insulating layer is a step of forming a gate insulating layer on the active layer. Examples of the step include the same step exemplified in the description of the step of forming the gate insulating layer in the first production method.

—Step of Forming Gate Electrode—

A step of forming the gate electrode is not particularly limited and may be appropriately selected depending on the intended purpose, so long as the step of forming the gate electrode is a step of forming a gate electrode on the gate insulating layer. Examples of the step include the same step exemplified in the description of the step of forming the gate electrode in the first production method.

In the second production method, the order of the step of forming the source electrode and the drain electrode and the step of forming the active layer is not taken into account. The step of forming the active layer may be performed after the step of forming the source electrode and the drain electrode, and the step of forming the source electrode and the drain electrode may be performed after the step of forming the active layer.

In the second production method, when the step of forming the active layer is performed after the step of forming the source electrode and the drain electrode, a top gate/bottom contact field-effect transistor can be produced.

In the second production method, the step of forming the source electrode and the drain electrode is performed after the step of forming the active layer, a top gate/top contact field-effect transistor can be produced.

(Semiconductor Element)

One aspect of a semiconductor element of the present invention includes the n-type oxide semiconductor film of the present invention.

Another aspect of a semiconductor element of the present invention includes the n-type oxide semiconductor film of the present invention in an active layer.

<Active Layer>

The active layer is not particularly limited and may be appropriately selected depending on the intended purpose, so long as the active layer includes the n-type oxide semiconductor film of the present invention.

The n-type oxide semiconductor film itself may be the active layer.

A structure, a shape, and a size of the active layer are not particularly limited and may be appropriately selected depending on the intended purpose.

Examples of the semiconductor element include a diode, a field-effect transistor, a light emitting element, and a photoelectric converting element.

<Diode>

The diode is not particularly limited and may be appropriately selected depending on the intended purpose. Examples of the diode include a diode including a first electrode, a second electrode, and the active layer formed between the first electrode and the second electrode. Examples of the aforementioned diode include a pn junction diode and a PIN photodiode.

—Pn Junction Diode—

The pn junction diode includes at least the active layer, and further includes the other members such as an anode (positive electrode) and a cathode (negative electrode) if necessary.

——Active Layer——

The active layer includes at least a p-type semiconductor layer and an n-type semiconductor layer, and further includes the other members if necessary.

The p-type semiconductor layer and the n-type semiconductor layer contact each other.

———P-Type Semiconductor Layer———

A material of the p-type semiconductor layer is not particularly limited and may be appropriately selected depending on the intended purpose.

An average thickness of the p-type semiconductor layer is not particularly limited and may be appropriately selected depending on the intended purpose, but is preferably from 50 nm through 2,000 nm.

———N-Type Semiconductor Layer———

The n-type semiconductor layer is the n-type oxide semiconductor film of the present invention.

An average thickness of the n-type semiconductor layer is not particularly limited and may be appropriately selected depending on the intended purpose, but is preferably from 50 nm through 2,000 nm.

———Anode (Positive Electrode)———

The anode contacts with the p-type semiconductor layer.

A material of the anode is not particularly limited and may be appropriately selected depending on the intended purpose. Examples of the material include metals (e.g., Mo, Al, Au, Ag, and Cu) and alloys of the metals, transparent conductive oxides such as indium tin oxide (ITO) and antymony-doped tin oxide (ATO), and organic conductors such as polyethylenedioxythiophene (PEDOT) and polyaniline (PANI).

A shape, a size, and a structure of the anode are not particularly limited and may be appropriately selected depending on the intended purpose.

The anode is provided to be in contact with the p-type semiconductor layer. An ohmic contact is preferably formed between the anode and the p-type semiconductor layer.

A method for forming the anode is not particularly limited and may be appropriately selected depending on the intended purpose. Examples of the method include (i) a method for forming the anode by forming a film by, for example, the sputtering method or the dip coating method to pattern the film through photolithography; and (ii) a method for forming the anode by directly forming a film having a desired shape by the printing process, such as inkjet printing, nanoimprinting, or gravure printing.

———Cathode (Negative Electrode)———

A material of the cathode is not particularly limited and may be appropriately selected depending on the intended purpose. Examples of the material include the same material as exemplified in the description of the anode.

A shape, a size, and a structure of the cathode are not particularly limited and may be appropriately selected depending on the intended purpose.

The cathode is provided to be in contact with the n-type semiconductor layer. An ohmic contact is preferably formed between the cathode and the n-type semiconductor layer.

A method for forming the cathode is not particularly limited and may be appropriately selected depending on the intended purpose. Examples of the method include the same method as exemplified in the description of the anode.

EXAMPLES

The present invention will next be described by way of Examples, but the present invention should not be construed as being limited to these Examples.

Example 1-1

<Preparation of Coating Liquid for Forming n-Type Oxide Semiconductor Film>

Yttrium 2-ethylhexanoate toluene solution (Y: 8% by mass), indium 2-ethylhexanoate toluene solution (In: 5% by mass), and titanium n-butoxide were provided and were weighed so that the metal elements Y, In, and Ti in the compounds were 5 mmol, 99.8 mmol, and 0.2 mmol, respectively. The above materials and mesitylene (800 mL) were added to a beaker. The materials were mixed and dissolved at room temperature to prepare a coating liquid for forming an n-type oxide semiconductor film.

Examples 1-2 to 1-12

Based on the material formulations presented in Table 1, coating liquids for forming n-type oxide semiconductor films of Examples 1-2 to 1-12 were prepared in the same manner as in Example 1-1.

TABLE 1

| Example | Coating liquid No | Material A Kind | mmol | Material B Kind | mmol | Material C Kind | mmol | Solvent D Kind | mL | Solvebt E Kind | mL | Solvent F Kind | mL |
|---|---|---|---|---|---|---|---|---|---|---|---|---|---|
| 1-1 | 1-1 | Y(C8H15O2)3 | 5 | In(C8H15O2)3 | 99.8 | Ti(OBu)4 | 0.2 | mesitylene | 800 | | | | |
| 1-2 | 1-2 | Se(NO3)3•5H2O | 15 | TlCl3•4H2O | 99.7 | ZrCl4 | 0.3 | PGME | 450 | EG | 450 | | |
| 1-3 | 1-3 | Ce(C8H15O2)3 | 18 | Tl(C8H15O2) | 99.6 | Nb(C8H15O2)4 | 0.4 | toluene | 700 | methyl lactate | 300 | | |
| 1-4 | 1-4 | CeCl3•7H2O | 10 | Tl(NO3)3•3H2O | 99.9 | MoO2(C5H7O2)2 | 0.1 | EGME | 440 | EG | 440 | | |
| 1-5 | 1-5 | Lu(NO3)3•6H2O | 6 | InCl3•4H2O | 99.95 | W(CO)6 | 0.05 | EGME | 420 | PG | 420 | | |

TABLE 1-continued

| Example | Coating liquid No | Material A Kind | mmol | Material B Kind | mmol | Material C Kind | mmol | Solvent D Kind | mL | Solvebt E Kind | mL | Solvent F Kind | mL |
|---|---|---|---|---|---|---|---|---|---|---|---|---|---|
| 1-6 | 1-6 | Al(NO3)3•9H2O | 5 | In(NO3)3•3H2O | 99.95 | Re2O7 | 0.05 | EGME | 420 | PG | 420 | | |
| 1-7 | 1-7 | B(OH)3 | 7 | HCOOTl | 99.95 | OsO4 | 0.05 | GBL | 300 | EG | 400 | THF | 100 |
| 1-8 | 1-8 | Ga(NO3)3•8H2O | 6 | Tl(NO3)3•3H2O | 99.9 | IrCl4 | 0.1 | DMAE | 160 | EG | 250 | IPA | 90 |
| 1-9 | 1-9 | Y(NO3)3•6H2O | 8 | InCl3•4H2O | 99.9 | PtCl4 | 0.1 | EGME | 430 | PG | 430 | | |
| 1-10 | 1-10 | La(NO3)3•6H2O | 5 | In(NO3)3•3H2O | 99.8 | SnCl2 | 0.2 | EGME | 270 | PG | 420 | MeOH | 150 |
| 1-11 | 1-11 | LaCl3•7H2O | 5 | In(NO3)3•3H2O | 99.5 | SbCl3 | 0.5 | EGME | 430 | EG | 430 | | |
| 1-12 | 1-12 | Gd(NO3)3•6H2O | 4 | In(NO3)3•3H2O | 99.9 | TeCl4 | 0.1 | DMF | 400 | BG | 630 | BuOH | 230 |

In Tables 1 and 2, names of the materials and the solvents used are as follows.

<Material A>
Y($C_8H_{15}O_2$)$_3$: Yttrium 2-ethylhexanoate
Sc(NO$_3$)$_3$·5H$_2$O: Scandium nitrate pentahydrate
Ce($C_8H_{15}O_2$)$_3$: Cerium 2-ethylhexanoate
CeCl$_3$·7H$_2$O: Cerium chloride heptahydrate
Lu(NO$_3$)$_3$·6H$_2$O: Lutetium nitrate hexahydrate
Al(NO$_3$)$_3$·9H$_2$O: Aluminium nitrate nonahydrate
B(OH)$_3$: Boric acid
Ga(NO$_3$)$_3$·8H$_2$O: Gallium nitrate octahydrate
Y(NO$_3$)$_3$·6H$_2$O: Yttrium nitrate hexahydrate
La(NO$_3$)$_3$·6H$_2$O: Lanthanum nitrate hexahydrate
LaCl$_3$·7H$_2$O: Lanthanum chloride heptahydrate
Gd(NO$_3$)$_3$·6H$_2$O: Gadolinium nitrate hexahydrate <Material B>
In($C_8H_{15}O_2$)$_3$: Indium 2-ethylhexanoate
TlCl$_3$·4H$_2$O: Thallium chloride tetrahydrate
Tl($C_8H_{15}O_2$): Thallium(I) 2-ethylhexanoate
Tl(NO$_3$)$_3$·3H$_2$O: Thallium nitrate trihydrate
InCl$_3$·4H$_2$O: Indium chloride tetrahydrate
In(NO$_3$)$_3$·3H$_2$O: Indium nitrate trihydrate
HCOOTl: Thallium formate
Tl(NO$_3$)$_3$·3H$_2$O: Thallium nitrate trihydrate <Material C>
Ti(OBu)$_4$: Titanium tetrabutoxide
ZrCl$_4$: Zirconium chloride
Nb($C_8H_{15}O_2$)$_4$: Niobium 2-ethylhexanoate
MoO$_2$($C_5H_7O_2$)$_2$: Bis(acetylacetonato)molybdenum(VI) oxide
W(CO)$_6$: Tungsten hexacarbonyl
Re$_2$O$_7$: Rhenium oxide
OsO$_4$: Osmium oxide
IrCl$_4$: Iridium chloride
PtCl$_4$: Platinum chloride
SnCl$_2$: Tin chloride
SbCl$_3$: Antimony chloride
TeCl$_4$: Tellurium chloride <Solvent D>
PGME: Propylene glycol monomethyl ether
EGME: Ethylene glycol monomethyl ether
GBL: Gamma-butyrolactone
DMF: N,N-dimethylformamide <Solvent E>
EG: Ethylene glycol
PG: 1,2-Propylene glycol
BG: 1,3-Butylene glycol <Solvent F>
THF: Tetrahydrofuran
IPA: Isopropanol
MeOH: Methanol
BuOH: 1-Butanol Comparative Examples 1-1 to 1-6

Based on the material formulations presented in Table 2, coating liquids of Comparative Examples 1-1 to 1-6 were prepared in the same manner as in Examples 1-1 to 1-12.

TABLE 2

| Comparative Example | Coating liquid No | Material A Kind | mmol | Material B Kind | mmol | Material C Kind | mmol | Solvent D Kind | mL | Solvent E Kind | mL | Solvent F Kind | mL |
|---|---|---|---|---|---|---|---|---|---|---|---|---|---|
| 1-1 | 1-21 | | | TlCl3•4H2O | 99.7 | ZrCl4 | 0.3 | PGME | 400 | EG | 400 | | |
| 1-2 | 1-22 | Al(NO3)3•9H2O | 99.95 | | | Re2O7 | 0.05 | EGME | 400 | PG | 400 | | |
| 1-3 | 1-23 | LaCl3•7H2O | 16 | In(NO3)3•3H2O | 99.5 | | | EGME | 440 | EG | 440 | | |
| 1-4 | 1-24 | | | In(NO3)3•3H2O | 99.8 | SnCl2 | 0.2 | EGME | 260 | PG | 400 | MeOH | 140 |
| 1-5 | 1-25 | Y(C8H15O2)3 | 99.8 | | | Ti(OBu)4 | 0.2 | Mesitylene | 800 | | | | |
| 1-6 | 1-26 | B(OH)3 | 14 | HCOOTl | 99.95 | | | GBL | 320 | EG | 420 | THF | 100 |

Example 1-13

Using an inkjet device, the coating liquid 1-6 in Table 1 was ejected on a Si substrate having a thermally oxidized film (thickness: 200 nm), which had been washed with UV-ozone, to print a fine pattern. The coating liquid was favorably ejected. The substrate was dried for 10 minutes on a hotplate that had been heated to 120 degrees Celsius. The substrate was baked for 1 hour at 400 degrees Celsius in the atmosphere, to obtain an n-type oxide semiconductor film having a desired pattern as presented in FIG. 6.

Examples 1-14 to 1-18

In the same manner as in Example 1-13, the coating liquid 1-2 (Example 1-14), the coating liquid 1-4 (Example 1-15), the coating liquid 1-5 (Example 1-16), the coating liquid 1-9 (Example 1-17), and the coating liquid 1-11 (Example 1-18) in Table 1 were each ejected, dried, and baked to obtain n-type oxide semiconductor films each having the same desired pattern as described above. All of the n-type oxide semiconductor films exhibited excellent ejecting property similar to Example 1-13.

Example 1-19

Using a spin coating device, the coating liquid 1-10 in Table 1 was printed on an alkali-free glass substrate that had been washed with UV-ozone. The film forming property was favorable. The substrate was dried at 120 degrees Celsius for 1 hour in the atmosphere in an oven, and was baked at 400 degrees Celsius for 1 hour in the atmosphere, to obtain an n-type oxide semiconductor film. As presented in Table 3, an average film thickness of 9 portions measured on the substrate was 30.70±0.52 nm, indicating formation of a uniform film. An area of 40 mm×40 mm in the film was divided into a lattice of 16 squares each having 10 mm×10 mm. The nine lattice points were measured for the average thickness.

TABLE 3

| Measurement portion | Film thickness nm |
| --- | --- |
| a | 30.87 |
| b | 31.20 |
| c | 30.53 |
| d | 31.80 |
| e | 30.58 |
| f | 30.18 |
| g | 30.77 |
| h | 30.46 |
| i | 29.93 |
| Average | 30.70 |
| Standard deviation | 0.52 |

Examples 1-20 to 1-24

In the same manner as in Example 1-19, the coating liquid 1-1 (Example 1-20), the coating liquid 1-3 (Example 1-21), the coating liquid 1-7 (Example 1-22), the coating liquid 1-8 (Example 1-23), and the coating liquid 1-12 (Example 1-24) in Table 1 were each ejected, dried, and baked to obtain n-type oxide semiconductor films. All of the n-type oxide semiconductor films exhibit the same excellent film forming property as presented in Example 1-19.

Examples 1-25 to 1-30

<Production of Field-Effect Transistor>
—Formation of Gate Electrode—

An alkali-free glass substrate was subjected to ultrasonic cleaning using a neutral detergent, pure water, and isopropyl alcohol. This substrate was dried and subjected to a treatment with UV-ozone at 90 degrees Celsius for 10 minutes. A film of Mo was formed on the alkali-free glass substrate by the DC magnetron method so as to have a thickness of 100 nm. The formed film was patterned by photolithography, to form a gate electrode.

—Formation of Gate Insulating Layer—

Next, a film of $SiO_2$ was formed on the gate electrode and the alkali-free glass substrate by the RF magnetron sputtering method so as to have a thickness of 300 nm, to obtain a gate insulating layer.

—Formation of Source Electrode and Drain Electrode—

Next, a film of ITO was formed on the gate insulating layer by the DC magnetron sputtering method so as to have a thickness of 100 nm. The formed film was patterned by photolithography to form a source electrode and a drain electrode. Here, a channel width determined by the length of the source electrode and the length of the drain electrode was 30 micro meters, and a channel length determined by the interval between the source electrode and the drain electrode was 10 micro meters.

—Formation of Active Layer—

Using an inkjet device, each of the coating liquid 1-2 (Example 1-25), the coating liquid 1-4 (Example 1-26), the coating liquid 1-5 (Example 1-27), the coating liquid 1-6 (Example 1-28), the coating liquid 1-9 (Example 1-29), and the coating liquid 1-11 (Example 1-30) was coated on a channel between the source electrode and the drain electrode formed.

The thus-obtained substrate was dried for 10 minutes on a hot plate that had been heated to 120 degrees Celsius. The substrate was baked for 1 hour at 450 degrees Celsius in the atmosphere. Moreover, the substrate was annealed at 300 degrees Celsius for 1 hour in the atmosphere to obtain an active layer. A channel part of the obtained active layer was found to have an average thickness of about 10 nm.

As described above, a field-effect transistor was produced.

Comparative Examples 1-7 to 1-9

Field-effect transistors were produced in the same manner as in Examples 1-25 to 1-30. Here, the coating liquid 1-21 (Comparative Example 1-7), the coating liquid 1-22 (Comparative Example 1-8), and the coating liquid 1-23 (Comparative Example 1-9) in Table 2 were used for forming active layers.

Examples 1-31 to 1-36

<Production of Field-Effect Transistor>

A gate electrode and a gate insulating film were formed on an alkali-free glass substrate in the same manner as in Examples 1-25 to 1-30.

—Formation of Active Layer—

Using a spin coater, each of the coating liquid 1-1 (Example 1-31), the coating liquid 1-3 (Example 1-32), the coating liquid 1-7 (Example 1-33), the coating liquid 1-8 (Example 1-34), the coating liquid 1-10 (Example 1-35), and the coating liquid 1-12 (Example 1-36) was coated on a channel between the source electrode and the drain electrode formed.

The thus-obtained substrate was dried in an oven at 120 degrees Celsius for 1 hour in the atmosphere. The dried substrate was baked at 400 degrees Celsius for 1 hour in the atmosphere to obtain an n-type oxide semiconductor film. Moreover, an active layer having a desired shape was obtained through photolithography.

—Formation of Source Electrode and Drain Electrode—

Next, a film of an aluminium alloy was formed by the DC magnetron sputtering method so as to have a thickness of 100 nm. The formed film was patterned by photolithography to form a source electrode and a drain electrode. Here, a channel width determined by the length of the source electrode and the length of the drain electrode was 30 micro meters, and a channel length determined by the interval between the source electrode and the drain electrode was 10 micro meters. Moreover, the substrate was annealed at 300 degrees Celsius for 1 hour in the atmosphere.

As described above, a field-effect transistor was produced.

Comparative Examples 1-10 to 1-12

Field-effect transistors were produced in the same manner as in Examples 1-31 to 1-36. The coating liquid 1-24 (Comparative Example 1-10), the coating liquid 1-25 (Comparative Example 1-11), and the coating liquid 1-26 (Comparative Example 1-12) in Table 2 were used for forming active layers.

<Evaluation>

—Volume Resistivity—

A semiconductor parameter analyzer (semiconductor parameter analyzer B1500A, available from Agilent Technologies, Inc.) was used to measure, by the two-terminal method, the obtained field-effect transistor for electric current when the voltage (from 0 V through ±20 V) was applied between the source and the drain to determine volume resistivity of the active layer. Results are presented in Tables 4 and 5.

—Carrier Mobility and ON/OFF Ratio—

A semiconductor parameter analyzer device (semiconductor parameter analyzer B1500A, available from Agilent Technologies, Inc.) was used to measure the obtained field-effect transistor for a relation between a gate voltage (Vgs) and a source-drain current (Ids) when a source-drain voltage (Vds) was 10 V. Results of Example 1-28 are presented in the graph of FIG. 7. From FIG. 7, it was confirmed that favorable transistor properties were obtained. Here, in FIG. 7, "E" denotes the exponent of 10. Specifically, "1E-04" is "0.0001". In Tables 4 and 5, this description was used. The carrier mobility was calculated in a saturated region. Also, an ON/OFF ratio was determined. Here, in the ON/OFF ratio, the ON value was an Ids value when the Vgs was equal to 20 V (Vgs=20 V). Results are presented in Tables 4 and 5.

TABLE 4

| Example | Coating liquid No | Volume resistivity $\Omega$cm | Von V | Ion A | Ioff A | Mobility $cm^2/Vs$ | on/off | NA/NB | NC/NB |
|---|---|---|---|---|---|---|---|---|---|
| 1-25 | 1-2 | 1.1E+00 | 1.2 | 8E−5 | 8E−14 | 5.6 | 1.0E+09 | 0.150 | 0.0030 |
| 1-26 | 1-4 | 5.0E−01 | 0.8 | 9E−5 | 5E−14 | 6.2 | 1.8E+09 | 0.100 | 0.0010 |
| 1-27 | 1-5 | 1.6E−01 | −0.3 | 2E−4 | 6E−14 | 9.5 | 3.3E+09 | 0.060 | 0.0005 |
| 1-28 | 1-6 | 2.5E−01 | −0.2 | 1E−4 | 3E−13 | 8.2 | 3.3E+08 | 0.050 | 0.0005 |
| 1-29 | 1-9 | 3.4E−01 | 0.5 | 1E−4 | 3E−14 | 7.3 | 3.3E+09 | 0.080 | 0.0010 |
| 1-30 | 1-11 | 1.3E−01 | −0.8 | 3E−4 | 9E−14 | 9.4 | 3.3E+09 | 0.050 | 0.0050 |
| 1-31 | 1-1 | 2.7E−01 | 0.4 | 2E−4 | 6E−14 | 8.7 | 3.3E+09 | 0.050 | 0.0020 |
| 1-32 | 1-3 | 2.0E+00 | 1.7 | 6E−5 | 8E−14 | 4.5 | 7.5E+08 | 0.181 | 0.0040 |
| 1-33 | 1-7 | 4.3E−01 | 0.7 | 1E−4 | 2E−13 | 7.2 | 5.0E+08 | 0.070 | 0.0005 |
| 1-34 | 1-8 | 1.6E−01 | −0.5 | 2E−4 | 1E−13 | 8.5 | 2.0E+09 | 0.060 | 0.0010 |
| 1-35 | 1-10 | 2.7E−01 | 0.2 | 3E−4 | 5E−14 | 10.5 | 6.0E+09 | 0.050 | 0.0020 |
| 1-36 | 1-12 | 1.2E−01 | −0.9 | 4E−4 | 7E−14 | 10.6 | 5.7E+09 | 0.040 | 0.0010 |

Each of the field-effect transistors obtained by incorporating, into the active layer, the n-type oxide semiconductor which was obtained by coating the coating liquid of the present invention for forming an n-type oxide semiconductor film used in Examples 1-25 to 1-36, exhibited favorable transistor properties (e.g., high carrier mobility even at a process temperature of about 450 degrees Celsius and large ON/OFF ratio).

When [NA/NB] satisfies the Formula (1) and [NC/NB] satisfies the Formula (2), volume resistivity of the active layer was considerably suitable as volume resistivity required for the active layer of the field-effect transistor. In addition, the transistors exhibit considerably excellent transistor properties such as considerably high carrier mobility and considerably high ON/OFF ratio.

Properties of the field-effect transistors of Comparative Examples 1-7 to 1-12 are presented in Table 5. In Comparative Examples 1-7 and 1-10, each transistor exhibited a strong depletion state in the TFT properties and thus Von was not clearly found. In Comparative Examples 8 and 11, Ids was smaller than 1 pA and thus each transistor did not exhibit an ON-state. In Comparative Examples 1-9 and 1-12, each transistor exhibited strong enhancement state and thus sufficient ON-current did not flow, resulting in low mobility.

TABLE 5

| Comparative Example | Coating liquid No | Volume resistivity $\Omega$cm | Von V | Ion A | Ioff A | Mobility $cm^2/Vs$ | on/off | NA/NB | NC/NB |
|---|---|---|---|---|---|---|---|---|---|
| 1-7 | 1-21 | 2.1E−02 | Not turned OFF | 4E−3 | 2E−3 | Unable to be calculated | 2.0E+00 | 0.00 | 0.003 |
| 1-8 | 1-22 | >1E+06 | Not turned ON | 3E−13 | 2E−13 | 0 | 1.5E+00 | ∞ | ∞ |
| 1-9 | 1-23 | 3.3E+03 | 12.2 | 3E−8 | 7E−14 | 0.6 | 4.3E+06 | 0.16 | 0.000 |
| 1-10 | 1-24 | 7.8E−02 | Not turned OFF | 1E−3 | 6E−4 | Unable to be calculated | 1.7E+00 | 0.00 | 0.002 |
| 1-11 | 1-25 | >1E+06 | Not turned ON | 9E−14 | 6E−14 | 0 | 1.5E+00 | ∞ | ∞ |
| 1-12 | 1-26 | 1.1E+02 | 4.3 | 8E−7 | 1E−13 | 1.1 | 8.0E+06 | 0.14 | 0.000 |

Example 2-1

<Preparation of Coating Liquid for Forming n-Type Oxide Semiconductor Film>

Zirconium chloride, titanium diisopropoxide bis(acetylacetonato) isopropanol solution (Ti: 10% by mass), and bis(acetylacetonato) molybdenum(VI) oxide were provided and were weighed so that the metal elements Zr, Ti, and Mo in the compounds were 3 mmol, 99.95 mmol, and 0.05 mmol, respectively. The above materials, ethylene glycol mono-n-butyl ether (440 mL), and 1,3-butylene glycol (440 mL) were added to a beaker. The materials were mixed and dissolved at room temperature to prepare a coating liquid for forming an n-type oxide semiconductor film.

Examples 2-2 to 2-10

Based on the material formulations presented in Table 6, coating liquids of Examples 2-2 to 2-10 for forming an n-type oxide semiconductor film were prepared in the same manner as in Example 2-1.

TABLE 6

| Example | Coating liquid No | Material A Kind | mmol | Material B Kind | mmol | Material C Kind | mmol | Solvent D Kind | mL | Solvent E Kind | mL | Solvent F Kind | mL |
|---|---|---|---|---|---|---|---|---|---|---|---|---|---|
| 2-1 | 2-1 | ZrCl4 | 3 | Ti(seac)2OiPr2 | 99.95 | MoO2(C5H7O2)2 | 0.05 | EGBE | 440 | BG | 440 | | |
| 2-2 | 2-2 | HfCl4 | 6 | TiCl4•2THF | 99.95 | W(CO)6 | 0.05 | PGME | 420 | PG | 420 | | |
| 2-3 | 2-3 | Ce(NO3)3•6H2O | 15 | SnCl2 | 99.95 | Re2O7 | 0.05 | EGME | 420 | PG | 420 | | |
| 2-4 | 2-4 | C6H19NSi2 | 6 | Pb(NO3)2 | 99.9 | RuO4 | 0.1 | DMF | 430 | BG | 430 | | |
| 2-5 | 2-5 | (CH3)2GeCl2 | 10 | Pb(CH3COO)2•3H2O | 99.5 | TeCl4 | 0.05 | DMAE | 440 | EG | 440 | | |
| 2-6 | 2-6 | ZrO(C8H15O2)2 | 6 | Ti(OBu)4 | 99.8 | Nb(C8H15O2)4 | 0.2 | Toluene | 800 | | | THF | 200 |
| 2-7 | 2-7 | C18H32HfO6 | 3 | C10H14O5Ti | 99.6 | C20H45O5Ta | 0.04 | Toluene | 700 | Methyl lactate | 300 | | |

TABLE 6-continued

| Example | Coating liquid No | Material A | | Material B | | Material C | | Solvent D | | Solvent E | | Solvent F | |
|---|---|---|---|---|---|---|---|---|---|---|---|---|---|
| | | Kind | mmol | Kind | mmol | Kind | mmol | Kind | mL | Kind | mL | Kind | mL |
| 2-11 | 2-8 | Ce(C8H15O2)3 | 7 | Sn(C8H15O2)2 | 99.95 | MoO2(C5H7O2)2 | 0.05 | 2-Ethyl-hexa-noic acid | 800 | | | | |
| 2-8 | 2-9 | C6H19NSi2 | 12 | [CH3COCHCOCH3]2 Sn(C4H9)2 | 99.9 | OsO4 | 0.1 | Mesit-ylene | 800 | Ethyl acetate | 200 | | |
| 2-10 | 2-10 | Cl6H36Ge | 6 | Pb(C8H15O2)2 | 99.8 | Sb(C6H5)3 | 0.2 | Mesit-ylene | 800 | | | THF | 200 |

In Tables 6 and 7, names of the materials and the solvents used are as follows.

<Material A>
ZrCl₄: Zirconium chloride
HfCl₄: Hafnium chloride
Ce(NO₃)₃·6H₂O: Cerium nitrate hexahydrate
C₆H₁₉NSi₂: Hexamethyl disilazane
(CH₃)₂GeCl₂: Dimethyl germanium dichloride
ZrO(C₈H₁₅O₂)₂: Bis(2-ethylhexanoate)zirconium(IV) oxide·mineral spirit solution (Zr: 12%)
C₁₈H₃₂HfO₆: HAFNIUM DI-n-BUTOXIDE (BIS-2,4-PENTANEDIONATE), 50% in toluene/n-butanol
Ce(C₈H₁₅O₂)₃: Cerium 2-ethylhexanoate
C₁₆H₃₆Ge: Tetrabutyl germane <Material B>
Ti(acac)₂OiPr₂: Titanium diisopropoxide bis(acetylacetonate)
TiCl₄·2THF: Titanium chloride(IV) tetrahydrofuran complex
SnCl₂: Tin chloride
Pb(NO₃)₂: Lead nitrate
Pb(CH₃COO)₂·3H₂O: Lead acetate trihydrate
Ti(OBu)₄: Titanium tetrabutoxide
C₁₀H₁₄O₅Ti: Bis(2,4-pentanedionato)titanium(IV) oxide
Sn(C₈H₁₅O₂)₂: Tin 2-ethylhexanoate
[CH₃COCHCOCH₃]₂Sn(C₄H₉)₂: Dibutyltin bis(acetylacetonate)
Pb(C₈H₁₅O₂)₂: Lead 2-ethylhexanoate <Material C>
MoO₂(C₅H₇O₂)₂: Bis(acetylacetonato) molybdenum(VI) oxide
W(CO)₆: Tungsten hexacarbonyl
Re₂O₇: Rhenium oxide
RuO₄: Ruthenium oxide
TeCl₄: Tellurium chloride
Nb(C₈H₁₅O₂)₄: Niobium 2-ethylhexanoate
C₂₀H₄₅O₅Ta: Tantalum(V) n-butoxide
MoO₂(C₅H₇O₂)₂: Bis(acetylacetonato) molybdenum(VI) oxide
OsO₄: Osmium oxide
Sb(C₆H₅)₃: Triphenylantimony <Solvent D>
EGBE: Ethylene glycol mono-n-butyl ether
PGME: Propylene glycol monomethyl ether
EGME: Ethylene glycol monomethyl ether
DMF: N,N-dimethylformamide <Solvent E>
EG: Ethylene glycol
PG: 1,2-Propylene glycol
BG: 1,3-Butylene glycol <Solvent F>
THF: Tetrahydrofuran Comparative Examples 2-1 to 2-6

Based on the material formulations presented in Table 7, coating liquids of Comparative Examples 2-1 to 2-6 were prepared in the same manner as in Examples 2-1 to 2-10.

TABLE 7

| Comparative Example | Coating liquid No | Material A | | Material B | | Material C | | Solvent D | | Solvent E | | Solvent F | |
|---|---|---|---|---|---|---|---|---|---|---|---|---|---|
| | | Kind | mmol | Kind | mmol | Kind | mmol | Kind | mL | Kind | mL | Kind | mL |
| 2-1 | 2-21 | HfCl4 | 5 | TiCl4•2THF | 99.95 | | | PGME | 420 | PG | 420 | | |
| 2-2 | 2-22 | | | SnCl2 | 99.95 | Re2O7 | 0.05 | EGME | 400 | PG | 400 | | |
| 2-3 | 2-23 | C6H19NSi2 | 99.9 | | | RuO4 | 0.1 | DMF | 400 | BG | 400 | | |
| 2-4 | 2-24 | ZrO(C8H15O2)2 | 5 | Ti(OBu)4 | 99.8 | | | Toluene | 800 | | | THF | 200 |
| 2-5 | 2-25 | Ce(C8H15O2)3 | 99.5 | | | MoO2(C6H7O2)2 | 0.5 | 2-Ethyl-hexanoic acid | 750 | | | | |
| 2-6 | 2-26 | | | Pb(C8H15O2)2 | 99.8 | Sb(C6H5)3 | 0.2 | Mesitylene | 800 | | | THF | 200 |

As described above, the field-effect transistor prepared in the present invention is suitable because it widens process margin, and stabilizes TFT properties at high level. Moreover, the display element of the present invention can be driven at high speed, and can lower unevenness between the elements, resulting in improvement in re-liability. Moreover, the image display device of the present invention is suitable for displaying an image having high quality even if being a large size. The system of the present invention can display image information with high precision, and can be suitably used for television devices and computer systems.

Aspects of the present invention are, for example, as follows.

<1> A coating liquid for forming an n-type oxide semiconductor film, the coating liquid including:
  a Group A element, which is at least one selected from the group consisting of Sc, Y, Ln, B, Al, and Ga;
  a Group B element, which is at least one of In and Tl;
  a Group C element, which is at least one selected from the group consisting of Group 4 elements, Group 5 elements, Group 6 elements, Group 7 elements, Group 8 elements, Group 9 elements, Group 10 elements, Group 14 elements, Group 15 elements, and Group 16 elements; and
  a solvent.
<2> The coating liquid for forming an n-type oxide semiconductor film according to <1>,
  wherein the Group A element is at least one selected from the group consisting of Sc, Y, and Ln.
<3> The coating liquid for forming an n-type oxide semiconductor film according to <1> or <2>,
  wherein a combination of the Group A element and the Group B element is a combination capable of forming a complex oxide having a bixbyite structure.
<4> The coating liquid for forming an n-type oxide semiconductor film according to any one of <1> to <3>,
  wherein the Group C element is at least one selected from the group consisting of Ti, Zr, Hf, V, Nb, Ta, Cr, Mo, W, Mn, Re, Fe, Ru, Os, Co, Rh, Ir, Ni, Pd, Pt, Ge, Sn, Pb, Sb, Bi, Se, and Te.
<5> A coating liquid for forming an n-type oxide semiconductor film, the coating liquid including:
  a Group A element, which is at least one selected from the group consisting of Zr, Hf, Ce, Si, and Ge;
  a Group B element, which is at least one selected from the group consisting of Ti, Sn, and Pb;
  a Group C element, which is at least one selected from the group consisting of Group 5 elements, Group 6 elements, Group 7 elements, Group 8 elements, Group 9 elements, Group 10 elements, Group 15 elements, and Group 16 elements; and
  a solvent.
<6> The coating liquid for forming an n-type oxide semiconductor film according to <5>,
  wherein the Group C element is at least one selected from the group consisting of V, Nb, Ta, Cr, Mo, W, Mn, Re, Ru, Os, Ir, Pt, Sb, Bi, Se, and Te.
<7> The coating liquid for forming an n-type oxide semiconductor film according to any one of <1> to <6>,
  wherein a total number of atoms of the Group A element (NA) and a total number of atoms of the Group B element (NB) satisfy Formula (1) below:

[Math.3]

$$0.02 \leq [NA/NB] \leq 0.2 \qquad \text{Formula (1)}$$

<8> The coating liquid for forming an n-type oxide semiconductor film according to any one <1> to <7>,
  wherein a total number of atoms of the Group C element (NC) and a total number of atoms of the Group B element (NB) satisfy Formula (2) below:

[Math.4]

$$0.0001 \leq [NC/NB] \leq 0.05 \qquad \text{Formula (2)}$$

<9> The coating liquid for forming an n-type oxide semiconductor film according to any one of <1> to <8>,
  wherein the coating liquid is obtained by dissolving, in the solvent, a Group A element-including compound including the Group A element, a Group B element-including compound including the Group B element, and a Group C element-including compound including the Group C element,
  wherein the Group A element-including compound includes at least one selected from the group consisting of inorganic salts, oxides, hydroxides, organic acid salts, metal alkoxides, organometallics, and metal complexes,
  wherein the Group B element-including compound includes at least one selected from the group consisting of inorganic salts, oxides, hydroxides, organic acid salts, metal alkoxides, organometallics, and metal complexes, and
  wherein the Group C element-including compound includes at least one selected from the group consisting of inorganic salts, oxides, hydroxides, organic acid salts, metal alkoxides, organometallics, and metal complexes.
<10> The coating liquid for forming an n-type oxide semiconductor film according to any one of <1> to <9>,
  wherein the solvent includes an organic solvent.
<11> The coating liquid for forming an n-type oxide semiconductor film according to <10>,
  wherein the organic solvent includes at least one selected from the group consisting of organic acids, organic acid esters, aromatic compounds, diols, glycol ethers, and aprotic polar solvents.
<12> A method for producing an n-type oxide semiconductor film, the method including:
  coating the coating liquid for forming an n-type oxide semiconductor film according to any one of <1> to <11> on an object to be coated; and
  drying the object and baking the object after the drying.
<13> A method for producing a field-effect transistor, the method including:
  forming a gate electrode on a substrate;
  forming a gate insulating layer on the gate electrode;
  forming a source electrode and a drain electrode on the gate insulating layer to be spaced from each other; and
  forming an active layer on the gate insulating layer, and in a channel region between the source electrode and the drain electrode, the active layer being formed of an n-type oxide semiconductor,
  wherein the forming the active layer is coating the coating liquid for forming an n-type oxide semiconductor film according to any one of <1> to <11> on the gate insulating layer to form the active layer formed of the n-type oxide semiconductor.
<14> A method for producing a field-effect transistor, the method including:
  forming a source electrode and a drain electrode on a substrate to be spaced from each other;

forming an active layer on the substrate and in a channel region between the source electrode and the drain electrode, the active layer being formed of an oxide semiconductor;
forming a gate insulating layer on the active layer; and
forming a gate electrode on the gate insulating layer,
wherein the forming the active layer is coating the coating liquid for forming an n-type oxide semiconductor film according to any one of <1> to <11> on the substrate to form the active layer formed of the oxide semiconductor.

<15> The method for producing a field-effect transistor according to <13> or <14>, wherein, the forming the active layer includes adjusting, in the coating liquid for forming an n-type oxide semiconductor film, a total number of atoms of the Group A (NA), a total number of atoms of the Group B (NB), and a total number of atoms of the Group C (NC) to control at least one selected from the group consisting of volume resistivity, carrier mobility, and carrier density of the n-type oxide semiconductor.

<16> An n-type oxide semiconductor film, which is obtained by coating the coating liquid for forming an n-type oxide semiconductor film according to any one of <1> to <11> on an object to be coated, to bake the object after drying the object.

<17> an n-type oxide semiconductor film, which is a baked product of the coating liquid for forming an n-type oxide semiconductor film according to any one of <1> to <11>.

<18> A semiconductor element including the n-type oxide semiconductor film according to <16> or <17>.

<19> A semiconductor element including an active layer including the n-type oxide semiconductor film according to <16> or <17>.

<20> The semiconductor element according to <18> or <19>,
wherein the semiconductor element is a diode.

<21> A field-effect transistor including:
a gate electrode configured to apply gate voltage;
a source electrode and a drain electrode;
an active layer formed between the source electrode and the drain electrode, and the active layer being formed of an n-type oxide semiconductor film; and
a gate insulating layer formed between the gate electrode and the active layer, wherein the n-type oxide semiconductor film is the n-type oxide semiconductor film according to <16> or <17>.

<22> A field-effect transistor including:
a gate electrode configured to apply gate voltage;
a source electrode and a drain electrode;
an active layer formed between the source electrode and the drain electrode, and the active layer being formed of an n-type oxide semiconductor film; and
a gate insulating layer formed between the gate electrode and the active layer,
wherein the n-type oxide semiconductor film is an n-type oxide semiconductor film obtained by coating the coating liquid for forming an n-type oxide semiconductor film according to any one of <1> to <11>.

DESCRIPTION OF THE REFERENCE NUMERAL 1 substrate
2 gate electrode
3 gate insulating layer
4 source electrode
5 drain electrode
6 active layer

The invention claimed is:

1. A coating liquid for forming a semiconductor oxide film comprising:
a Group A element, which is a preventer from generation of oxygen vacancies, and which is at least one selected from the group consisting of Zr, Hf, Ce, Si, and Ge;
a Group B element, which is a main constituting element of a bottom of a conduction band of the semiconductor oxide film, and which is at least one selected from the group consisting of Ti and Sn;
a Group C element, which is a dopant, and which is at least one selected from the group consisting of Group 5 elements, Group 6 elements, Group 7 elements, Group 8 elements, Group 9 elements, Group 10 elements, Group 15 elements, and Group 16 elements; and
a solvent,
wherein a valence of the Group A element is the same as that of the Group B element;
wherein the Group C element is at least one selected from the group consisting of V, Nb, Ta, Cr, Mo, W, Re, Ru, Os, Ir, Pt, Sb, Bi, Se, and Te,
wherein the coating liquid does not include a Group 1 element, a Group 2 element, a Group 3 element, a Group 11 element, a Group 12 element, and a Group 13 element, except that Ce of the Group 3 elements may be present, and
wherein a total number of atoms of the Group A element (NA) and a total number of atoms of the Group B element (NB) satisfy the following formula:

$$0.02 \leq [NA/NB] \leq 0.2.$$

2. The coating liquid according to claim 1, wherein the solvent comprises an organic solvent.

3. The coating liquid according to claim 2,
wherein the organic solvent comprises at least one selected from the group consisting of organic acids, organic acid esters, aromatic compounds, dials, glycol ethers, and aprotic polar solvents.

4. A method for producing an n-type oxide semiconductor film, the method comprising:
coating the coating liquid according to claim 1 on an object to be coated; and
drying the object and baking the object after the drying.

5. A method for producing a field-effect transistor, the method comprising:
forming a gate electrode on a substrate;
forming a gate insulating layer on the gate electrode;
forming a source electrode and a drain electrode on the gate insulating layer to be spaced from each other; and
forming an active layer on the gate insulating layer, and in a channel region between the source electrode and the drain electrode, the active layer being formed of an n-type oxide semiconductor,
wherein the forming the active layer is coating the coating liquid according to claim 1 on the gate insulating layer to form the active layer formed of the n-type oxide semiconductor.

6. A method for producing a field-effect transistor, the method comprising:
forming a source electrode and a drain electrode on a substrate to be spaced from each other;

forming an active layer on the substrate and in a channel region between the source electrode and the drain electrode, the active layer being formed of an n-type oxide semiconductor;

forming a gate insulating layer on the active layer; and forming a gate electrode on the gate insulating layer, wherein the forming the active layer is coating the coating liquid according to claim 5 on the substrate to form the active layer formed of the n-type oxide semiconductor.

7. The method for producing a field-effect transistor according to claim 5, wherein; the forming the active layer comprises adjusting, in the coating liquid, a total number of atoms of the Group A (NA), a total number of atoms of the Group B (NB), and a total number of atoms of the Group C (NC) to control at least one selected from the group consisting of volume resistivity, carrier mobility, and carrier density of the n-type oxide semiconductor.

8. An n-type oxide semiconductor film, which is a baked product of the coating liquid according to claim 1.

9. A semiconductor element comprising an active layer including the n-type oxide semiconductor film according to claim 8.

10. The semiconductor element according to claim 9, wherein the semiconductor element is a diode.

11. A field-effect transistor comprising:

a gate electrode;

a source electrode and a drain electrode;

an active layer formed between the source electrode and the drain electrode, and being formed of an n-type oxide semiconductor film; and a gate insulating layer formed between the gate electrode and the active layer, wherein the n-type oxide semiconductor film is the n-type oxide semiconductor film according to claim 8.

* * * * *